(12) United States Patent
Sakakura et al.

(10) Patent No.: US 9,257,670 B2
(45) Date of Patent: Feb. 9, 2016

(54) DISPLAY DEVICE

(71) Applicant: Semiconductor Energy Laboratory Co., Ltd., Kanagawa-ken (JP)

(72) Inventors: Masayuki Sakakura, Kanagawa (JP); Hiromichi Godo, Kanagawa (JP); Kaoru Tsuchiya, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 14/556,858

(22) Filed: Dec. 1, 2014

(65) Prior Publication Data

US 2015/0129858 A1 May 14, 2015

Related U.S. Application Data

(60) Continuation of application No. 13/775,455, filed on Feb. 25, 2013, now Pat. No. 8,901,806, which is a continuation of application No. 12/351,983, filed on Jan. 12, 2009, now Pat. No. 8,382,545, which is a division of application No. 10/868,920, filed on Jun. 16, 2004, now Pat. No. 7,486,368.

(30) Foreign Application Priority Data

Jun. 27, 2003 (JP) .................................. 2003-184354

(51) Int. Cl.
*H01J 1/62* (2006.01)
*H01J 63/04* (2006.01)
(Continued)

(52) U.S. Cl.
CPC ........ *H01L 51/5246* (2013.01); *H01L 27/3246* (2013.01); *H01L 33/44* (2013.01);
(Continued)

(58) Field of Classification Search
CPC ........... F21K 2/08; H01J 63/00; H05B 33/00; C09K 11/02; C09K 11/025
USPC ..................... 313/483, 495–497; 349/153, 43
See application file for complete search history.

(56) References Cited

U.S. PATENT DOCUMENTS

| | | |
|---|---|---|
| 5,684,365 A | 11/1997 | Tang et al. |
| 5,882,761 A | 3/1999 | Kawami et al. |

(Continued)

FOREIGN PATENT DOCUMENTS

| | | |
|---|---|---|
| CN | 001380634 A | 11/2002 |
| EP | 0 776 147 A1 | 5/1997 |

(Continued)

OTHER PUBLICATIONS

Miyashita, S. et al., "Full Color Displays Fabricated by Ink-Jet Printing," ASIA Display / IDW '01, 2001, pp. 1399-1402.

(Continued)

*Primary Examiner* — Joseph L Williams
(74) *Attorney, Agent, or Firm* — Husch Blackwell LLP

(57) ABSTRACT

A novel display device with higher reliability having a structure of blocking moisture and oxygen, which deteriorate the characteristics of the display device, from penetrating through a sealing region and a method of manufacturing thereof is provided. According to the present invention, a display device and a method of manufacturing the same comprising: a display portion formed by aligning a light-emitting element using an organic light-emitting material between a pair of substrate, wherein the display portion is formed on an insulating layer formed on any one of the substrates, the pair of substrates is bonded to each other with a sealing material formed over the insulating layer while surrounding a periphery of the display portion, at least one layer of the insulating layer is made of an organic resin material, the periphery has a first region and a second region, the insulating layer in the first region has an opening covered with a protective film, the sealing material is formed in contact with the opening and the protective film, an outer edge portion of the insulating layer in the second region is covered with the protective film or the sealing material.

18 Claims, 18 Drawing Sheets

(51) Int. Cl.
   *G02F 1/1339* (2006.01)
   *H05B 33/04* (2006.01)
   *H01L 51/52* (2006.01)
   *H05B 33/14* (2006.01)
   *H01L 33/44* (2010.01)
   *H01L 27/32* (2006.01)

(52) U.S. Cl.
   CPC ............ *H01L51/5237* (2013.01); *H05B 33/04* (2013.01); *H05B 33/14* (2013.01); *H01L 2251/5323* (2013.01)

(56) References Cited

U.S. PATENT DOCUMENTS

| | | | |
|---|---|---|---|
| 6,016,033 | A | 1/2000 | Jones et al. |
| 6,198,217 | B1 | 3/2001 | Suzuki et al. |
| 6,338,910 | B1 | 1/2002 | Ishibashi et al. |
| 6,359,606 | B1 | 3/2002 | Yudasaka |
| 6,424,401 | B1 | 7/2002 | Kang et al. |
| 6,476,988 | B1 | 11/2002 | Yudasaka |
| 6,605,826 | B2 | 8/2003 | Yamazaki et al. |
| 6,646,284 | B2 | 11/2003 | Yamazaki et al. |
| 6,664,732 | B2 | 12/2003 | Yamazaki et al. |
| 6,704,072 | B2 | 3/2004 | Jeong et al. |
| 6,717,181 | B2 | 4/2004 | Murakami et al. |
| 6,781,162 | B2 | 8/2004 | Yamazaki et al. |
| 6,781,746 | B2 | 8/2004 | Yamazaki et al. |
| 6,822,264 | B2 | 11/2004 | Yamazaki et al. |
| 6,822,391 | B2 | 11/2004 | Yamazaki et al. |
| 6,828,727 | B2 | 12/2004 | Yamazaki |
| 6,833,560 | B2 | 12/2004 | Konuma et al. |
| 6,833,668 | B1 | 12/2004 | Yamada et al. |
| 6,852,997 | B2 | 2/2005 | Yamazaki et al. |
| 6,861,297 | B2 | 3/2005 | Kwak et al. |
| 6,864,508 | B2 | 3/2005 | Yamazaki et al. |
| 6,864,943 | B2 | 3/2005 | Hirakata et al. |
| 6,906,773 | B2 | 6/2005 | Choi |
| 6,933,537 | B2 | 8/2005 | Yee et al. |
| 6,956,325 | B2 | 10/2005 | Yamazaki et al. |
| 6,982,779 | B2 | 1/2006 | Park et al. |
| 6,992,439 | B2 | 1/2006 | Yamazaki et al. |
| 7,019,718 | B2 | 3/2006 | Yamazaki et al. |
| 7,112,115 | B1 | 9/2006 | Yamazaki et al. |
| 7,129,523 | B2 | 10/2006 | Yamazaki et al. |
| 7,133,100 | B2 | 11/2006 | Ahn |
| 7,154,578 | B2 | 12/2006 | Kim |
| 7,190,115 | B2 | 3/2007 | Tsuchiya et al. |
| 7,223,643 | B2 | 5/2007 | Ohnuma et al. |
| 7,264,979 | B2 | 9/2007 | Yamagata et al. |
| 7,265,391 | B2 | 9/2007 | Yamazaki et al. |
| 7,271,411 | B2 | 9/2007 | Koyama et al. |
| 7,307,279 | B2 | 12/2007 | Yamazaki et al. |
| 7,405,484 | B2 | 7/2008 | Usui et al. |
| 2001/0002703 | A1 | 6/2001 | Koyama |
| 2001/0005607 | A1 | 6/2001 | Hasegawa et al. |
| 2001/0017684 | A1 | 8/2001 | Hirakata et al. |
| 2001/0024254 | A1 | 9/2001 | Kwak et al. |
| 2002/0011975 | A1 | 1/2002 | Yamazaki et al. |
| 2002/0025591 | A1 | 2/2002 | Ohnuma et al. |
| 2002/0030443 | A1 | 3/2002 | Konuma et al. |
| 2002/0044111 | A1 | 4/2002 | Yamazaki et al. |
| 2002/0057055 | A1 | 5/2002 | Yamazaki et al. |
| 2002/0113248 | A1 | 8/2002 | Yamagata et al. |
| 2002/0180371 | A1 | 12/2002 | Yamazaki et al. |
| 2002/0190256 | A1 | 12/2002 | Murakami et al. |
| 2003/0062533 | A1 | 4/2003 | Yee et al. |
| 2003/0094615 | A1 | 5/2003 | Yamazaki et al. |
| 2003/0122978 | A1 | 7/2003 | Lim |
| 2003/0227021 | A1 | 12/2003 | Yamazaki et al. |
| 2004/0031962 | A1 | 2/2004 | Hasegawa et al. |
| 2004/0185301 | A1 | 9/2004 | Tsuchiya et al. |
| 2004/0232418 | A1 | 11/2004 | Koyama et al. |
| 2004/0263740 | A1 | 12/2004 | Sakakura et al. |
| 2005/0045891 | A1 | 3/2005 | Yamazaki et al. |
| 2005/0046346 | A1 | 3/2005 | Tsuchiya et al. |
| 2005/0156519 | A1 | 7/2005 | Yoshizawa et al. |
| 2005/0218396 | A1 | 10/2005 | Tsuchiya et al. |
| 2006/0006799 | A1 | 1/2006 | Yamazaki et al. |
| 2006/0199461 | A1 | 9/2006 | Yamazaki et al. |
| 2006/0249733 | A1 | 11/2006 | Yamazaki et al. |
| 2006/0261338 | A1 | 11/2006 | Yamazaki et al. |
| 2008/0116795 | A1 | 5/2008 | Tsuchiya et al. |
| 2008/0124848 | A1 | 5/2008 | Yamazaki et al. |
| 2008/0213929 | A1 | 9/2008 | Yamazaki et al. |
| 2008/0311737 | A1 | 12/2008 | Usui et al. |

FOREIGN PATENT DOCUMENTS

| | | |
|---|---|---|
| EP | 0 985 719 A2 | 3/2000 |
| EP | 0 993 235 A2 | 4/2000 |
| EP | 1 045 451 A2 | 10/2000 |
| EP | 1 235 100 A2 | 8/2002 |
| EP | 1 780 589 A2 | 5/2007 |
| EP | 1 786 037 A2 | 5/2007 |
| JP | 07-169567 A | 7/1995 |
| JP | 09-148066 A | 6/1997 |
| JP | 10-335060 A | 12/1998 |
| JP | 11-271753 A | 10/1999 |
| JP | 2000-173766 A | 6/2000 |
| JP | 2001-203076 A | 7/2001 |
| JP | 2001-230071 A | 8/2001 |
| JP | 2001-357973 A | 12/2001 |
| JP | 2002-311853 A | 10/2002 |
| JP | 2002-324666 A | 11/2002 |
| JP | 2002-329576 A | 11/2002 |
| JP | 2003-100446 A | 4/2003 |
| JP | 2003-272856 A | 9/2003 |
| JP | 2003-297552 A | 10/2003 |
| JP | 2005-505141 | 2/2005 |
| KR | 2000-0023041 A | 4/2000 |
| KR | 2001-0006970 A | 1/2001 |
| TW | 200300292 | 5/2003 |
| TW | I248140 | 1/2006 |
| TW | I251933 | 3/2006 |
| WO | WO 03/030275 A1 | 4/2003 |

OTHER PUBLICATIONS

International Search Report re Application No. PCT/JP2003/015764, dated Apr. 20, 2004.
Austrian Patent Office Search Report re Singapore Patent Application No. 200403680-2, dated Jul. 31, 2007.
Office Action re Chinese Application No. CN 200410069424.X, dated May 30, 2008.
Tsuchiya, K. et al., "Amendment C," re U.S. Appl. No. 10/919,605, dated Jun. 11, 2008.
Taiwanese Office Action re Application No. TW 93117545, dated Jan. 17, 2011.
Taiwanese Office Action re Application No. TW 93117545, dated Jun. 16, 2011.
Chinese Office Action re Application No. CN 201110278735.7, dated Aug. 8, 2013.

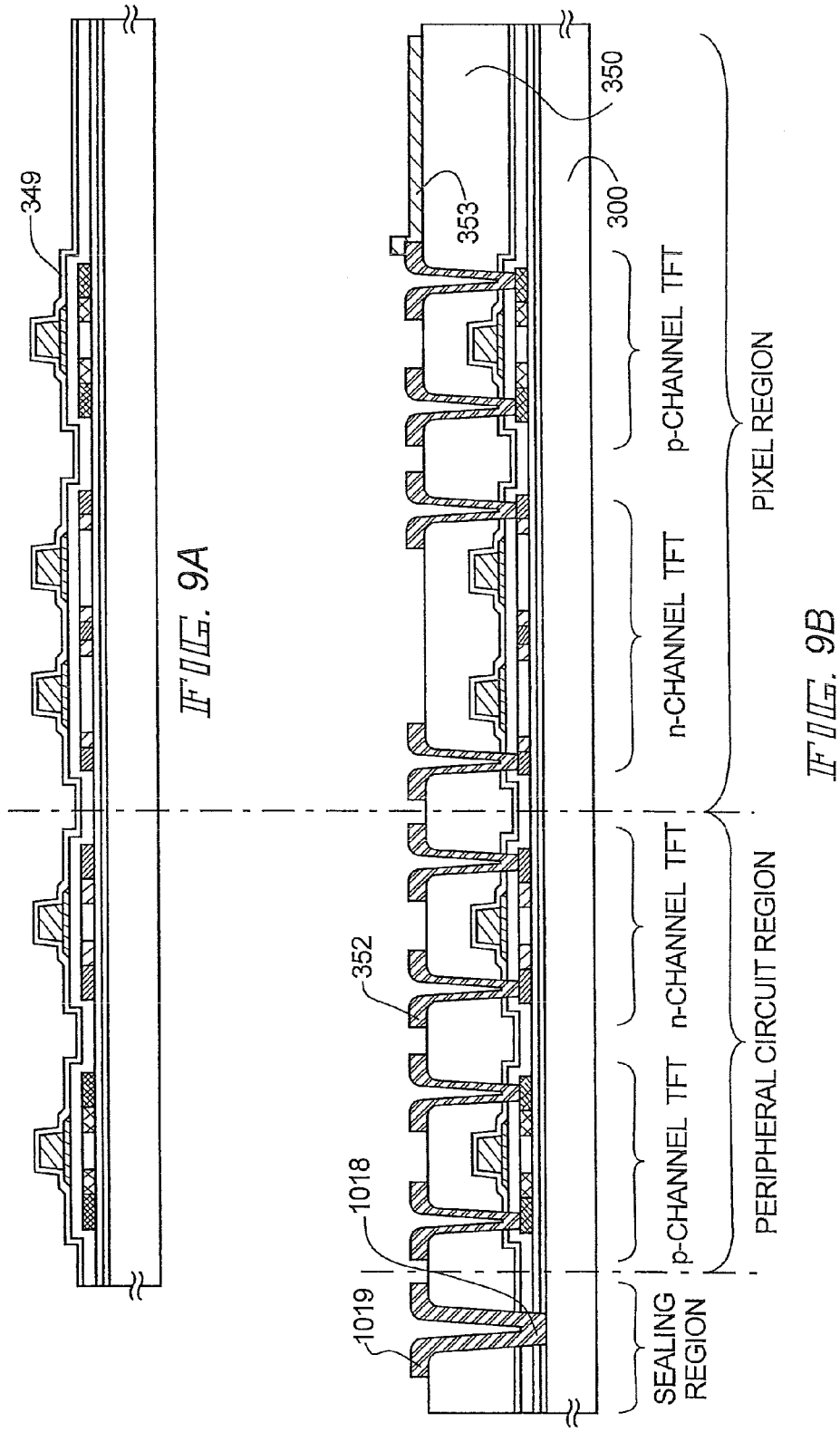

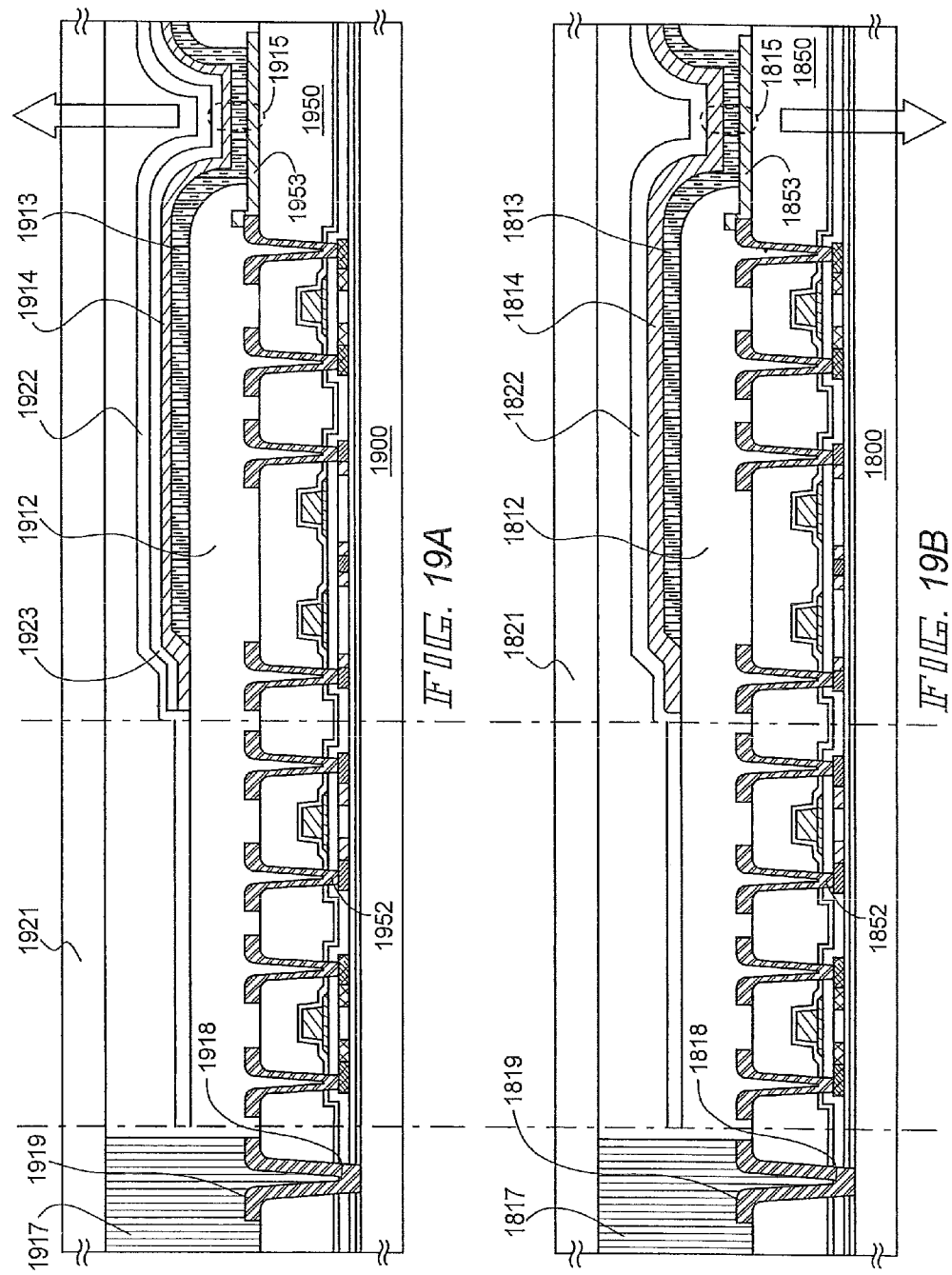

SEALING REGION | PIXEL REGION

DISPLAY DEVICE

This application is a continuation of copending U.S. application Ser. No. 13/775,455, filed on Feb. 25, 2013 which is a continuation of U.S. application Ser. No. 12/351,983, filed on Jan. 12, 2009 (now U.S. Pat. No. 8,382,595 issued Feb. 26, 2013) which is a divisional of U.S. application Ser. No. 10/868,920, filed on Jun. 16, 2004 (now U.S. Pat. No. 7,486,368 issued Feb. 3, 2009), all of which are incorporated herein by reference.

BACKGROUND OF THE INVENTION

1. Field of the Invention

The present invention relates to a display device comprising an element (hereinafter referred to as a light-emitting element) in which a light-emitting material is interposed between a pair of electrode, and to a method of manufacturing thereof. More particularly, the present invention relates to a sealing structure of a display device using a light-emitting material that generates electroluminescence (EL) and a method of manufacturing the same.

2. Description of the Related Art

In recent years, development of a display device (EL display device) using a light-emitting element (hereinafter referred to as an EL element) which utilizes electroluminescent phenomenon of a light-emitting material has been advanced. Since the light-emitting element of the EL display device is a self-luminous type, a backlight, which is used for a conventional liquid crystal display device, is unnecessary. In addition, the EL display device has merits of the wide viewing angle, the excellent visibility and the like.

It has been said that the EL element emits photons as follows. By applying a voltage to an organic compound layer interposed between a pair of electrodes, electrons injected from a cathode and positive holes injected from an anode recombine together at a center of luminescence in the organic compound layer to form excited molecules, and hence, energy is released to emit photons when the excited molecules return to the base state. There are known two different excited states: a singlet excited state; and a triplet excited state. Luminescence can be generated through either of the states.

Although there are inorganic light-emitting materials and organic light-emitting materials as the material used for the EL element, the organic light-emitting materials which can be driven at lower voltage than the inorganic light-emitting materials has been attracting much attention.

However, when the EL element comprising an organic material is driven for a certain period, luminance and light emitting properties such as nonuniformity of light emission are drastically deteriorated as compared with those in the initial state, which results in a problem of low reliability. The low reliability of the EL element is a limiting factor in practical application of the EL material.

Further, moisture and oxygen which penetrate from outside into the EL element are another factor of deteriorating the reliability of the EL element.

In an EL display device (panel) using an EL element, moisture penetrating into the interior of the device causes a serious degraded reliability, which further reads to a dark spot, shrinkage, and deterioration in luminance from a periphery of The EL display device. The dark spot is a phenomenon in which luminance is partly degraded (which includes nonluminous portion), and is generated when a hole is formed in an upper electrode. Meanwhile, the shrinkage is a phenomenon in which luminance is deteriorated from edges of a pixel.

Accordingly, a display device comprising a structure for preventing the above-mentioned deteriorations of the EL element has been researched and developed. In order to prevent the foregoing problems, there is a method in which the EL element is accommodated in an airtight container and a desiccant is provided in an airtight space (for example, see patent document 1).

[Patent Document 1]

Japanese Patent Application Laid-Open No. Hei 9-148066

Further, there is another method in which a sealing material is formed on an insulator with the EL element formed thereon, and an airtight space surrounded by a covering material and the sealing material is filled with a filler such as a resin so as to shield the EL element from an exterior portion (for example, see patent document 2).

[Patent Document 2]

Japanese Patent Application Laid-Open No. 13-203076

FIG. 5 shows a top view of the EL display device as disclosed in the patent document 2. Reference numeral 401 surrounded by a doted line denotes a source side driving circuit, reference numeral 402 denotes a gate side driving circuit, reference numeral 403 denotes a pixel portion, and reference numeral 409 denotes a flexible printed circuit (FPC). Further, reference numeral 404 denotes a covering material, reference numeral 405 denotes a first sealing material, and reference numeral 406 denotes a second sealing material. FIG. 6 shows a cross sectional view of a conventional EL display device as illustrated in FIG. 5 (the second sealing material 406 is not illustrated therein). In FIG. 6, reference numeral 800 is a substrate, reference numeral 801 is an electrode, reference numeral 811 is a pixel electrode, reference numeral 812 is an insulating film, reference numeral 813 is an EL layer, reference numeral 814 is a cathode, and reference numeral 815 is an EL element. As illustrated in FIG. 6, in a sealing region, the EL element is encapsulated in an interior portion with the sealing material 817.

According to the patent documents 1 and 2, in the sealing region, the EL element is protected from moisture exists outside by providing the sealing material as depicted in FIG. 6.

With respect to the patent document 1, however, when the structure in which the EL element is accommodated in the airtight container is taken, the EL display device is grown in size for the size of the airtight container. Although the EL display device is only grown in size, the light-emitting area is not changed. Therefore, the advantage of a thin EL display device, which dispenses with a backlight, cannot be utilized.

Furthermore, with respect to the patent document 2, since the sealing material is applied to a substrate to form the airtight space in the sealing region, it is inevitable that the EL display device is grown in size.

As set forth above, as the area of the sealing region is increased, nonluminous regions are further increased. Accordingly, it is inevitable that the display device is grown in size in order to obtain a light-emitting portion with a desired area.

In view of the above mentioned problems, a display device with a narrow frame in which the sealing region is made as narrow as possible has been researched and developed (for example, see patent document 3).

[Patent Document 3]

Japanese Patent Application Laid-Open No. 2002-329576

In the patent document 3, a sealing pattern used for sealing is formed over a substrate with a depression formed thereon.

When the width of the sealing pattern in the sealing region is narrowed in order to achieve a narrower frame portion, since the surface area through which the sealing pattern and the substrate contact becomes large, reduction in the bond strength therebetween can be suppressed.

However, in the patent document 3, the sealing material is applied over the substrate in the sealing region as well as the patent documents 1 and 2, and therefore there is a limitation on a narrower frame formation.

Further, there is another method in which the sealing material is directly applied to a film such as an interlayer film, and a protective film as substitute for the substrate so as to eliminate the sealing region for applying the sealing material. An EL display device manufactured according to this method is illustrated in FIG. 7. An enlarged cross sectional view of an edge of the sealing region taken along a line C-C' in FIG. 5 is illustrated in FIG. 14.

As depicted in FIG. 14, a first coating film 53, a second coating film 54, a third coating film 55, and a fourth coating film 56 are laminated over a substrate 50 in a display device. Further, a sealing material 52 is applied thereon. This structure allows to reduce the sealing region. The first coating film 53, the second coating film 54, the third coating film 55, and the fourth coating film 56 corresponds to a base film, a gate insulating film, a protective film, an interlayer film, a conductive film, and the like, respectively.

However, when the sealing material for sealing is formed over a laminated film as illustrated in FIG. 14, each laminated film is directly in contact with an ambient air outside of the display device. Therefore, moisture and oxygen existing outside of the display device penetrate into the display device through the each laminated film. In addition, when a material having high moisture permeability such as acrylic is used as the interlayer film, more moisture and oxygen penetrate into the display device.

Moisture and oxygen penetrate through the acrylic included in the interlayer film or top and bottom interfaces of acrylic by using the acrylic as a path. The moisture and oxygen ultimately reach to the EL element via a disconnection portion in a contact hole due to poor film formation properties of source and drain electrodes and the like. The interior of the EL display device and the EL element are contaminated by these moisture and oxygen, thereby causing various deteriorations such as deterioration of the electric characteristics, a dark spot, and shrinkage.

SUMMARY OF THE INVENTION

In view of the foregoing problems, it is an object of the present invention to provide an EL display device with higher reliability by preventing intrusion of moisture and oxygen that reads to deterioration in characteristics of an EL element, without increasing the size of the device, and to provide a method of manufacturing thereof.

In the present invention, a film having functions of blocking contaminants from penetrating into the display device, protecting a display element, and preventing various deteriorations is referred to as a protective film.

A display device of the present invention comprises: a pair of substrates; an insulating layer comprising an organic resin material, formed over one of the substrates; a display portion formed over the insulating layer, the display portion comprising a light-emitting element including an organic material; and a sealing material surrounding a periphery of the display portion, formed over the insulating layer, wherein the pair of substrates is bonded to each other with the sealing material, wherein the periphery of the display portion comprises a first region and a second region, wherein the insulating layer in the first region has an opening covered with a protective film, and the sealing material is formed in contact with the opening and the protective film, and wherein an outer edge portion of the insulating layer in the second region is covered with the protective film or the sealing material.

A display device of the present invention comprises: an insulating layer comprising an organic resin material, formed over one of the substrates; a display portion formed over the insulating layer, the display portion comprising a light-emitting element including an organic material; and a sealing material surrounding a periphery of the display portion, formed over the insulating layer, wherein the pair of substrates is bonded to each other with the sealing material, wherein the periphery of the display portion comprises a first region and a second region, wherein the insulating layer in the first region comprises a plurality of depressions and projections covered with a protective film, and the sealing material is formed in contact with the plurality of depressions and projections and the protective film, and wherein an outer edge portion of the insulating layer in the second region is covered with the protective film or the sealing material.

A display device of the present invention comprises: first and second substrates; an insulating layer comprising an organic resin material, formed over the first substrate; a display portion formed over the insulating layer, the display portion comprising a light-emitting element including an organic material; and a sealing material surrounding a periphery of the display portion, formed over the insulating layer, wherein the first and second substrates are bonded to each other with the sealing material, wherein the periphery of the display portion comprises a first region and a second region, wherein the insulating layer and the second substrate in the first region has a plurality of depressions and projections, the plurality of depressions and projections of the insulating layer are covered with a protective film, wherein in the first region, the sealing material is formed in contact with the plurality of depressions and projections covered with the protective film and the plurality of depressions and projections of the second substrate, and wherein an outer edge portion of the insulating layer in the second region is covered with the protective film or the sealing material.

A display device of the present invention comprises: first and second substrates; an insulating layer comprising an organic resin material, formed over the first substrate; a display portion formed over the insulating layer, the display portion comprising a light-emitting element including an organic material; and a sealing material surrounding a periphery of the display portion, formed over the insulating layer, wherein the first and second substrates are bonded to each other with the sealing material, wherein the periphery of the display portion comprises a first region and a second region, wherein the insulating layer and the second substrate comprises a plurality of depressions and projections covered with a protective film, wherein the sealing material in the first region is formed in contact with the insulating layer, the plurality of depressions and projections of the second substrate, and the protective film, and wherein an outer edge portion of the insulating layer in the second region is covered with the protective film or the sealing material.

The first substrate comprising the insulating layer and the second substrate are adhered to each other so as to match the depressions with the corresponding projection formed thereon respectively, and therefore the sealing material sandwiched by these substrates is pressed and extended to a gap between the depressions and projections to bond the substrates. Accordingly, even if minute amounts of moisture and oxygen intrude from the sealing material, since the moisture and oxygen have to move through a long zigzag path along the depressions and projections, they hardly penetrate into the interior of the display device. As a result, the effect of blocking the contaminants can be further improved, thereby providing a display device having high reliability.

According to the above-mentioned structure, the outer edge portion of the insulating layer in the first region may be coated with the protective film or the sealing material. In the case of covering the outer edge portion of the insulating layer, the insulating layer is not exposed to the atmospheric air, and hence, the effect of blocking the contaminants is further enhanced. Note that the outer edge portion of the insulating layer may be coated with the sealing material. In such case, the outer edge portion is preferably covered with a sealing material having a film thickness and width that do not damage the effect of narrower frame formation.

According to the above-mentioned structure, the protective film may be made of one kind or plural kinds of films selected from thin conductive films and thin insulating films. As for the thin conductive films, a film made of one kind or plural kinds of elements selected from the group consisting of Al, Ti, Mo, W, and Si may be employed. Meanwhile, as for the thin insulating films, a film made of one kind or plural kinds of materials selected from silicon nitride, silicon oxide, silicon oxynitride, aluminum nitride, aluminum oxynitride, aluminum nitride oxide, aluminum oxide, diamond like carbon (DLC), a carbon nitride film (CN), siloxane polymer may be used.

According to the above-mentioned structure, as for the organic resin material, a film composed of one kind or plural kinds of materials selected from acrylic, polyamide, polyimide, resist, benzocyclobutene, and siloxane polymer, or laminated layer of these, etc. may be used. The siloxane polymer is a material in which a skeleton structure is composed by bonding silicon (Si) and oxygen (O), and a substituent comprises at least one kind of hydrogen, fluorine, alkyl group, and aromatic hydrocarbon. A film formed by applying siloxane polymer and then burning can be referred to as a silicon oxide film (SiOx) containing alkyl group.

A method of manufacturing a display device of the present invention comprises: forming an insulating layer comprising an organic resin material over a first substrate; forming an opening in the insulating film; forming a protective film on the opening; forming a display portion comprising a light-emitting element including an organic material over the insulating layer; forming a sealing material surrounding a periphery of the display portion, in contact with the opening and the protective film; and bonding the first substrate to a second substrate with the sealing material, wherein the periphery has a first region and a second region, wherein the opening is formed in the insulating layer of the first region, and wherein an outer edge portion of the insulating layer in the second region is covered with the protective film or the sealing material.

A method of manufacturing a display device of the present invention comprises: forming an insulating layer comprising an organic resin material over a first substrate; forming a plurality of depressions and projections in the insulating film; forming a protective film on the plurality of depressions and projections; forming a display portion comprising a light-emitting element including an organic material over the insulating layer; forming a sealing material surrounding a periphery of the display portion, in contact with the plurality of depressions and projections and the protective film; and bonding the first substrate to a second substrate with the sealing material, wherein the periphery has a first region and a second region, wherein the plurality of depressions and projections are formed in the insulating layer of the first region, and wherein an outer edge portion of the insulating layer in the second region is covered with the protective film or the sealing material.

A method of manufacturing a display device of the present invention comprises: forming an insulating layer comprising an organic resin material over a first substrate; forming a plurality of depressions and projections in the insulating layer; covering the plurality of depressions and projections with a protective film; forming a display portion comprising a light-emitting element including an organic material over the insulating layer; forming a sealing material surrounding a periphery of the display portion over the insulating layer; and bonding the first substrate to a second substrate with the sealing material, wherein the periphery has a first region and a second region, wherein the plurality of depressions and projections formed in the insulating layer is provided in the first region, wherein in the first region, the sealing material is formed in contact with the plurality of depressions and projections covered with the protective film and a plurality of depressions and projections formed on the second substrate, and wherein an outer edge portion of the insulating layer in the second region is covered with the protective film or the sealing material.

A method of manufacturing a display device of the present invention comprises: forming an insulating layer comprising an organic resin material over a first substrate; forming a plurality of depressions and projections on the insulating layer, covering the plurality of depressions and projections on the insulating layer with a protective film; forming a display portion comprising a light-emitting element including an organic material over the insulating layer; forming a sealing material surrounding a periphery of the display portion over the insulating layer; and bonding the first substrate to a second substrate with the sealing material, wherein a plurality of depressions and projections are formed on the second substrate, and the plurality of depressions and projections on the second substrate is covered with a protective film, wherein the periphery has a first region and a second region, wherein the plurality of depressions and projections on the insulating layer is provided in the first region, wherein in the first region, the sealing material is in contact with the protective films covering the plurality of depressions and projections on the insulating layer and the second substrate, and wherein an outer edge portion of the insulating layer in the second region is covered with the protective film or the sealing material.

The first substrate comprising the insulating layer and the second substrate are adhered to each other so as to fit the depressions into the corresponding projections formed thereon respectively, and therefore the sealing material sandwiched by these substrates is pressed and extended to a gap between the depressions and projections to bond the substrates. Accordingly, even if minute amounts of moisture and oxygen intrude from the sealing material, since the moisture and oxygen have to move through a long zigzag path along the depressions and projections, they hardly penetrate into the interior of the display device. As a result, the effect of blocking the contaminants can be further improved, thereby providing a display device having high reliability.

According to the above-mentioned structure, the outer edge portion of the insulating layer located outside of the sealing material may be coated with the protective film. In the case of covering the outer edge portion of the insulating layer, the insulating layer is not exposed to the atmospheric air, and hence, the effect of blocking the contaminants is further enhanced. Note that the outer edge portion of the insulating layer may be coated with the sealing material. In such case, the outer edge portion is preferably covered with a sealing material having a film thickness and width that do not damage the effect of narrower frame formation.

According to the above-mentioned structure, the protective film may be made of one kind or plural kinds of films selected from thin conductive films and thin insulating films. As for the thin conductive films, a film made of one kind or plural kinds of elements selected from the group consisting of Al, Ti, Mo, W, and Si may be employed. Meanwhile, as for the thin insulating films, a film made of one kind or plural kinds of materials selected from silicon nitride, silicon oxide, silicon oxynitride, aluminum nitride, aluminum oxynitride, aluminum nitride oxide, aluminum oxide, diamond like carbon (DLC), a carbon nitride film (CN), siloxane polymer may be used.

According to the above-mentioned structure, as for the organic resin material, a film composed of one kind or plural kinds of materials selected from acrylic, polyamide, polyimide, resist, benzocyclobutene, and siloxane polymer, or laminated layer of these etc. may be used.

According to the present invention, the path for moisture in the insulating layer which contains the organic resin material of the display device is blocked. Therefore, it is possible to prevent moisture and oxygen exist outside of the display device from penetrating into a display element in the interior of the display device via the insulating film containing an organic material with a hygroscopic property and the like. In addition, it is also possible to prevent various deteriorations caused by moisture and oxygen such as contamination of the interior of the display device, deterioration in the electric characteristics, a dark spot, and shrinkage, thereby enhancing the reliability of the display device. Since the film constituting the display device is used as the protective film according to the present invention, the display device with high reliability can be manufactured without increasing the number of steps.

By utilizing the structure of the present invention, following advantageous effects can be obtained.

According to the present invention, it is possible to prevent moisture and oxygen exist outside of a display device from penetrating into a display element in the interior of the display device via an insulating film containing an organic material with a hygroscopic property and the like. Therefore, various deteriorations caused by moisture and oxygen such as contamination of the interior of the display device, deterioration of the electric characteristics, a dark spot, and shrinkage can be prevented, thereby enhancing the reliability of the display device.

In addition, since a film constituting the display device and a film used as a protective film are simultaneously formed by a same material in the invention, the display device with high reliability can be manufactured without increasing the number of steps.

The display device manufactured above comprises a structure of blocking contaminants in a sealing region of an edge portion of a display device, and hence, the operational characteristics and reliability of the display device can be improved sufficiently. Furthermore, electronic appliances using the display device of the present invention can exhibit high degrees of reliability.

BRIEF DESCRIPTION OF THE DRAWINGS

In the accompanying drawings:

FIGS. 9A and 9B are cross sectional views showing steps for manufacturing an active matrix substrate;

FIGS. 19A and 19B are cross sectional views showing a display device according to the present invention;

DETAILED DESCRIPTION OF THE PREFERRED EMBODIMENTS

Figure 1:
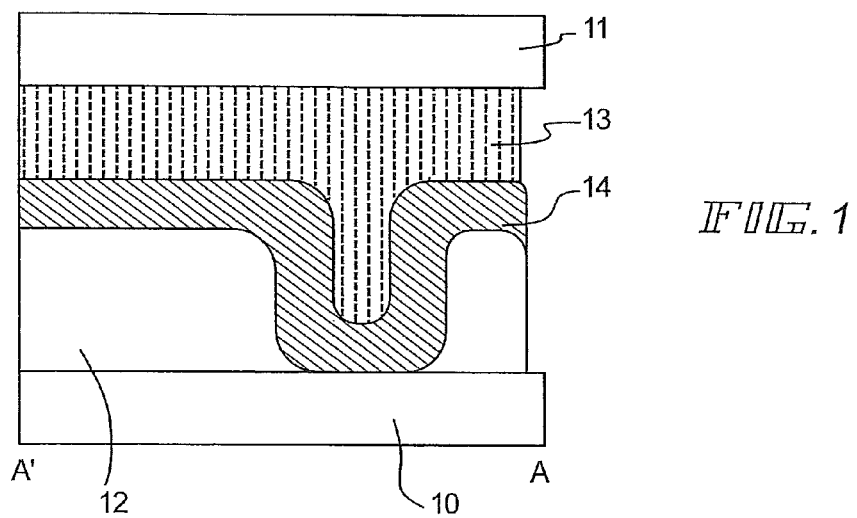
FIG. 1 is a diagram showing a structure according to the present invention.

The present invention has been fully described by way of Embodiment Modes and Embodiments with reference to the accompanying drawings. As has been easily understood by the person skilled in the art, the present invention can be embodied in several forms, and the embodiment modes and its details can be changed and modified without departing from the purpose and scope of the present invention. Accordingly, interpretation of the present invention should not be limited to descriptions mentioned in the foregoing embodiment modes and embodiments. Note that in the structures according to the present invention described above, portions identical to each other or portions having a similar function are commonly denoted by same reference numerals in the accompanying drawings such that additional descriptions are omitted.

Embodiment Mode 1

Preferred embodiment modes of the invention will hereinafter be described with reference to the accompanying drawings.

Figure 17:
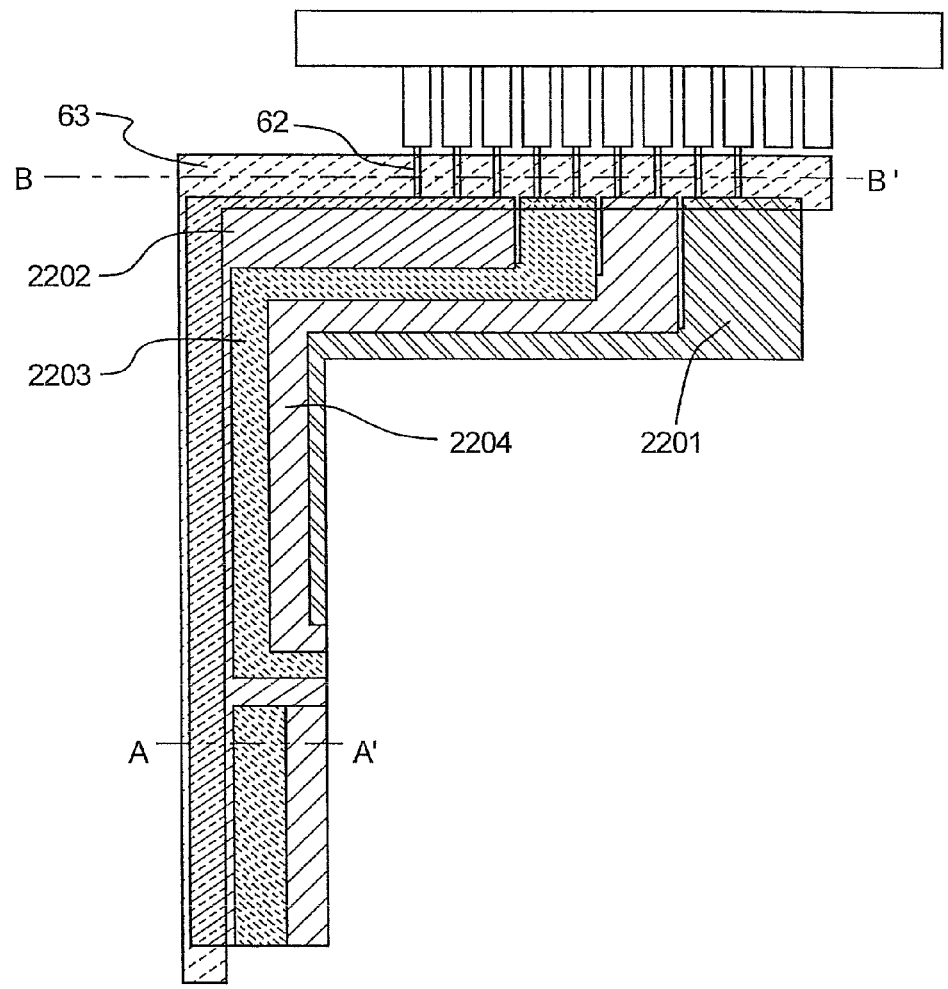
FIG. 17 is a top view of a display device according to the present invention.

FIG. 17 is a tow view of a display device according to the present invention. An edge portion of the display device taken along a line A-A' in FIG. 17 is described in FIG. 1. In FIG. 1, an opening is formed in an insulating layer 12 containing an organic resin material, and the opening is covered with a protective film 14. A sealing material 13 is applied over the protective film 14 so as to fill a depression due to the opening. A substrate 10 comprising the depression and opposing substrate 11 are adhered (or bonded) to each other with the sealing material 13. In the embodiment mode, the protective film 14 and wirings are made of the same material through the same steps.

In Embodiment Mode 1, the opening is only formed in the insulating layer containing the organic resin material. However, another opening may be formed in an insulating layer on which a gate insulating film, an interlayer film and the like are laminated, and may be covered with the protective film and then the sealing material may be applied thereon. Of course, the laminated film constituting the insulating layer may include a conductive film. In the present invention, such laminated film is referred to as an insulating layer in the sense that the laminated layer includes an organic resin material. On the insulating layer, a display element made of an organic light-emitting material is formed.

The insulating layer containing the organic resin material, which can serve as a path for contaminants, is isolated by the protective film inside the display device. Accordingly, the insulating layer is protected with the sealing material and the protective film formed thereon, and therefore the contaminants cannot penetrate into the interior of the display device even if outer edge portions of the insulating layer in the display device are exposed to the atmospheric air and moisture and oxygen exist outside of the display device penetrate into the display device through a gap between the interlayer films or the other films. Therefore, it is possible to prevent various deteriorations due to moisture, oxygen etc. such as contamination of the interior of the display device, deterioration of the electric characteristics, a dark spot, and shrinkage, thereby improving the reliability of the display device. In addition, a film constituting the display device and the protective film are simultaneously formed by using a same material, and hence, the reliability of the display device to be manufactured can be further improved without increasing the number of steps.

The protective film may be formed of one or more kinds of films selected from thin conductive films and thin insulating films. As for the thin conductive films, a film made of one or more kinds of elements selected from the group consisting of Al, Ti, Mo, W, and Si may be employed. Meanwhile, as for the thin insulating films, a film made of one or more kinds of materials selected from silicon nitride, silicon oxide, silicon oxynitride, aluminum nitride, aluminum oxynitride, aluminum nitride oxide, aluminum oxide, diamond like carbon (DLC), a carbon nitride film (CN), siloxane polymer may be used.

The insulating layer may be made of a film comprising one or more kinds of materials selected from inorganic materials (such as silicon oxide, silicon nitride, silicon oxynitride, and silicon nitride oxide) and photosensitive or nonphotosensitive organic resin materials (such as polyimide, acrylic, polyamide, polyimide amide, resist, benzocyclobutene, and siloxane polymer), or a laminated layer of these and the like. The siloxane polymer can be made of an inorganic-siloxane-based insulating material including a Si—O—Si bond, and an organosiloxane-based insulating material in which an organic radical such as methyl and phenyl is substituted for hydrogen bonded silicon among compounds comprising silicon, oxygen, and hydrogen formed by using a siloxane-based material as a starting material.

Note that a plurality of openings may be formed in the insulating film. The plurality of openings may be partly or entirely covered with the protective film and the sealing film. Further, each opening may be formed at any portion inside of the display device.

Although the opening is formed so as to contact with the glass substrate 10 in FIG. 1 of the present embodiment mode, the structure of the present invention is not limited to the structure. That is, the insulating film containing an organic material having a hygroscopic property and the like may be covered with the protective film, and a depression due to the formation of the opening may be filled with the sealing material so as to seal the opening, and therefore, the opening may be formed until the opening reaches to a film having dense structure such as a silicon nitride film.

Figure 3:
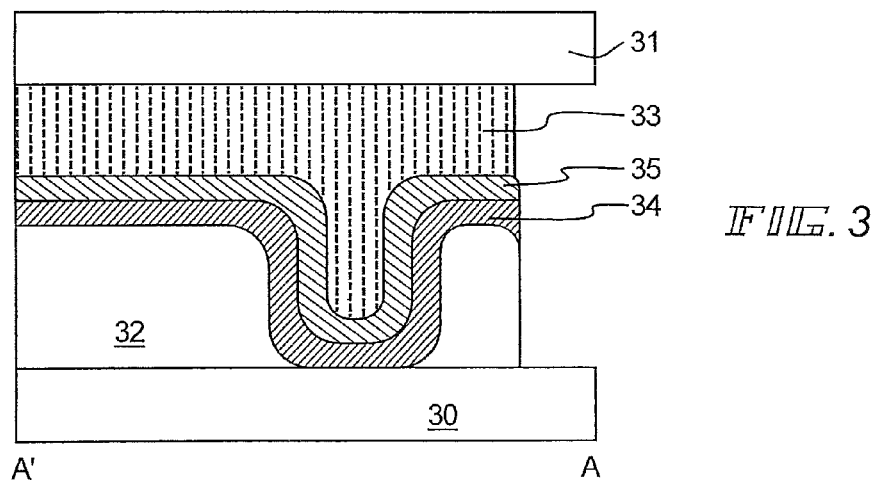
FIG. 3 is a diagram showing a structure according to the present invention.

Meanwhile, two or more protective films may be formed as a first protective film 34 and a second protective film 35 as depicted in FIG. 3 rather than only one protective film. In FIG. 3, a substrate 30 and an opposing substrate 31 are bonded to each other with a sealing material 33, and an insulating layer 32 on the substrate is isolated by the protective films 34 and 35. In order to prevent short circuit in the interior of the insulated display device, a portion to be covered with the protective film is necessary to be designed by a mask etc. When the insulating layer is shielded with the two-layered protective films, the effect of blocking the contaminants can be further improved as compared with the case of using a single-layer protective film.

Further, the inclined surface of the opening is desirably smooth. When the inclined surface of the opening is not smooth, the protective film covering the surface thereof is affected by the unevenness on the surface of the opening. The protective film is destroyed in the portion of thinner film thickness. The contaminants cannot be blocked sufficiently by such destroyed protective film, thereby reducing the advantageous effect of the present invention. Accordingly, when the opening has a in smooth surface, favorable coverage of the protective film laminated on the opening can be obtained, thereby improving the advantageous effect of the present invention. Therefore, it is preferable to perform wet etching on a film to form an opening thereon by using a photosensitive material such that unevenness formed on the surface of the film is reduced and its smoothness of the surface is improved.

As set forth above, the display device in which the frame of the display device is narrowed and the contaminants due to the deterioration are blocked can be obtained.

Embodiment Mode 2

Another embodiment mode of the present invention will hereinafter be described in more detail with reference to the accompanying drawings.

Figure 2:
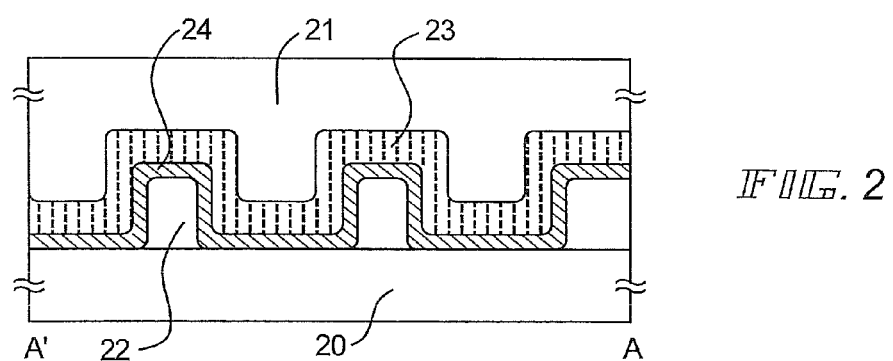
FIG. 2 is a diagram showing a structure according to the present invention.

FIG. 17 is a top view of a display device according to the present invention. An edge portion of the display device taken along a line A-A' in FIG. 17 is illustrated in FIG. 2. In FIG. 2, a plurality of openings is formed in an insulating layer 22 containing an organic resin material. The surface of the insulating layer 22 comprised depressions and projections. Each opening is covered with a protective film 24. In Embodiment Mode 2, an opposing substrate 21 attached to the substrate 20 is also comprises depressions and projections in the direction of the substrate 20 side. The opposing substrate 21 and the substrate 20 are adhered (or bonded) to each other with a sealing material 23 such that the depressions and the corresponding projections of each substrate are matched with each other.

Since the substrate 20 comprising the insulating layer and the opposing substrate 21 are bonded to each other such that the respective depressions and projections thereof are matched with each other, the sealing material sandwiched therebetween is pressed and extended to the gap between the depressions and projections to bond the substrates. Accordingly, when minute amounts of moisture and oxygen intrude from the sealing material, since the moisture and oxygen have to move through a long zigzag path along the depressions and projections, they hardly penetrate into the interior of the display device. As a result, the effect of blocking the contaminants can be improved, thereby providing a display device having high reliability. In this embodiment mode, the protective film and a wiring are made of the same material through the same steps.

The number of the depressions and projections formed on the substrate 20 comprising the insulating layer and the opposing substrate 21 is not limited. Further how to fit the depressions into the corresponding projections is not limited to the present embodiment mode, and the depressions may face each other while the projections may face each other, or the depressions may be fit into the corresponding projections, respectively.

The depressions and projections formed on the opposing substrate may be formed by processing the substrate, or a film having the depressions and projections may be formed on the opposing substrate. The film having the depressions and projections is preferably made of a substance which can block the contaminants as well as the protective film.

The protective film 24 may be made of one kind or plural kinds of films selected from thin conductive films and thin insulating films. As the thin conductive films, a film made of one kind or plural kinds of elements selected from the group consisting of Al, Ti, Mo, W, and Si may be used. Meanwhile, as the thin insulating films, a film made of one kind or plural kinds of materials selected from silicon nitride, silicon oxide, silicon oxynitride, aluminum nitride, aluminum oxynitride, aluminum nitride oxide, aluminum oxide, diamond like carbon (DLC), a carbon nitride film (CN) siloxane polymer may be used.

The insulating layer may be made of a film comprising one or more kinds of materials selected from inorganic materials (such as silicon oxide, silicon nitride, silicon oxynitride, and silicon nitride oxide) and photosensitive or nonphotosensitive organic resin materials (such as polyimide, acrylic, polyamide, polyimide amide, resist, benzocyclobutene, and siloxane polymer), or a laminated layer of these and the like.

In Embodiment Mode 2, each opening is formed only in the film containing the organic resin material. In addition to that, the openings may be formed in an insulating layer with a gate insulating film, an interlayer film and the like laminated thereon, and covered with the protective film and then applied with the sealing material. Of course, the laminated film constituting the insulating layer may comprise a conductive film. In the present invention, such laminated film is referred to as an insulating layer at least in the sense that the laminated layer includes the organic resin material. On the insulating layer, a display element made of an organic light-emitting material is formed.

The insulating layer containing the organic resin material, which can serve as a path for contaminants, is isolated by the protective film in the interior of the display device. Accordingly, the insulating layer is shielded with the sealing material and the protective film formed thereon, and therefore the contaminants cannot penetrate into the interior of the display device even if outer edge portions of the insulating layer in the display device are exposed to the atmospheric air and moisture and oxygen exist outside of the display device penetrate into the display device through the gap between the interlayer films or the other films. Therefore, it is possible to prevent various deteriorations due to moisture, oxygen and the like such as contamination of the interior of the display device, deterioration of the electric characteristics, dark spots, and shrinkage, thereby improving the reliability of the display device. In addition, a film constituting the display device and the protective film are simultaneously formed by using the same material, and hence, the reliability of the display device to be manufactured can be further improved without increasing the number of steps.

The organic resin materials such as acrylic, polyamide, and polyimide may be used for the insulating layer, and the materials for the insulating layer is not limited thereto.

A plurality of openings may be formed in the insulating layer, and the openings may be partly or entirely covered with the protective film and the sealing material. The openings may be formed at any portion in the interior of the display device.

Although the openings are formed so as to contact with the glass substrate 20 in FIG. 2 of the present embodiment mode, the structure of the present invention is not limited thereto. That is, the insulating film containing an organic material having a hygroscopic property may be covered with the protective film, and the depressions due to the formation of the openings may be filled with the sealing material so as to seal the openings, and therefore, the openings may be formed until the opening reaches to a film having dense structure such as a silicon nitride film.

Figure 4:
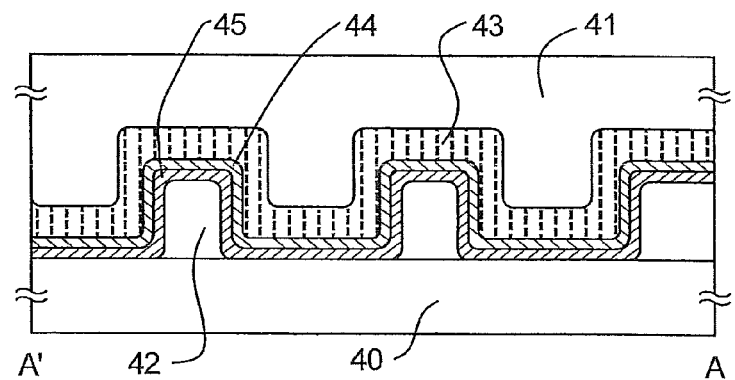
FIG. 4 is a diagram showing a structure according to the present invention.

Meanwhile, not only one protective film but also two or more protective films may be formed as depicted in FIG. 4. In FIG. 4, a substrate 40 and an opposing substrate 41 are bonded to each other with a sealing material 43, and an insulating layer 42 on the substrate is isolated by a protective films 44 and 45. In order to prevent short circuit in the insulated display device, when the insulating film is covered with a conductive film, a portion to be covered with the protective film is necessary to be designed by a mask etc. When the insulating layer is shielded with the two-layer protective films, the effect of blocking the contaminants can be further improved as compared with the case of using a one-layer protective film.

Further, inclined surfaces of the openings covered with the protective films are desirably smooth. When the inclined surfaces of the openings are not smooth, the protective films covering the surface thereof are affected by the shape of the unevenness on the surfaces. The protective films are destroyed in the portion of thin film thickness. The contaminants cannot be sufficiently blocked by such destroyed protective film, and the advantageous effect of the present invention is lessened. Accordingly, when the openings have smooth surfaces, favorable coverage of the protective films formed thereon can be obtained, thereby improving the advantageous effect of the present invention. Therefore, it is preferable to perform wet etching on a film to form an opening thereon by using a photosensitive material such that unevenness formed on the surface of the film is reduced and its smoothness of the surface is improved.

As set forth above, the display device with high reliability in which the frame of the display device is narrowed and the contaminants causing various deteriorations are blocked can be obtained.

EMBODIMENT

Embodiment 1

Embodiment 1, an example of manufacturing a display device having a dual emission structure according to the present invention will hereinafter be described. In the present invention, a display panel in which an EL element formed on a substrate is sealed between the substrate and a covering material and a display module comprising TFTs in the display panel are generically referred to as the display device. The EL element comprises a layer including an organic compound that generates electroluminescence (a light emitting layer), an anode layer, and a cathode layer. Luminescence obtained from organic compounds is classified into light emission upon returning to the base state from singlet excited state (fluorescence) and light emission upon returning to the base state from triplet excited state (phosphorescence). EL materials, which can be used for the present invention, include all light-emitting materials that emit photons via either the singlet excited state or the triplet excited state, or via each excited state.

In the present invention, all the layers that are formed between an anode and a cathode in an EL element are collectively defined as a light-emitting layer. Specifically, the light-emitting layer includes an EL layer, a hole injecting layer, an electron injecting layer, a hole transporting layer, an electron transporting layer, etc. Basically, the EL element comprises a structure in which an anode layer, an EL layer, and a cathode layer are sequentially laminated. In addition to that, the EL element may also comprises a structure in which an anode layer, a hole injecting layer, an EL layer, a cathode layer, etc. are sequentially laminated, or another structure in which an anode layer, a hole injecting layer, an EL layer, an electron transporting layer, a cathode layer, etc. are sequentially laminated.

As a base film 301, a silicon oxynitride film with a thickness of from 10 nm to 200 nm (preferably, from 50 nm to 100 nm) is formed on a substrate 300 having an insulated surface, and a silicon nitride oxide film with a thickness of form 50 nm to 200 nm (preferably, from 100 nm to 150 nm) is laminated thereon by plasma CVD. In this embodiment, the silicon oxynitride film with a thickness of 50 nm and the silicon nitride oxide film with a thickness of 100 nm are formed by plasma CVD. As for the substrate 300, a glass substrate, a quartz substrate, a silicon substrate, a metal substrate, or a stainless substrate each of which has an insulated surface on a surface thereof may be used. In addition, a plastic substrate or a flexible substrate, which can withstand processing temperatures of this embodiment, may be used. Further, a two-layer structure may be adopted as the base film, and a single-layer film or a laminated structure having more than two layers of the base (insulating) film may also be adopted.

Subsequently, a semiconductor film is formed on the base film. The semiconductor film may be formed to have a thickness of from 25 nm to 200 nm (preferably, from 30 nm to 150 nm) by a known technique (sputtering, LPCVD, plasma CVD, and the like). A material for the semiconductor film is not particularly limited, however, the semiconductor film is preferably formed of silicon or a silicon germanium (SiGe) alloy.

In this embodiment, an amorphous silicon film is formed as the semiconductor film to have a thickness of 54 nm by plasma CVD. In this embodiment, the amorphous silicon film is crystallized by thermal crystallization and laser crystallization with the use of a metal element for promoting crystallization. Alternatively, without introducing the metal element into the amorphous silicon film, hydrogen included in the amorphous silicon film may be released to lower hydrogen concentration to $1 \times 10^{20}$ atoms/cm$^3$ or less by heating under a nitrogen atmosphere at a temperature of 500° C. for one hour. Thereafter, the laser crystallization may be performed. The dehydrogenation is performed because the amorphous silicon film is damaged by laser irradiation when the film contains much hydrogen.

Nickel is used as the metal element, and is doped into the amorphous silicon film by solution application. The method of doping the metal element into the amorphous silicon film is not particularly limited on condition that the metal element can exist on the surface of or inside the amorphous silicon film. For example, a method such as sputtering, CVD, plasma processing (including plasma CVD), adsorption, and a method for applying a metal salt solution can be employed. Among them, the method using the metal salt solution is simply and easily performed, and is useful for easily adjusting concentration of the metal element. At this time, an oxide film is preferably formed by ultraviolet (UV) ray irradiation under an oxygen atmosphere, thermal oxidation, treatment with ozone water or hydrogen peroxide including hydroxyl radical, and the like in order to improve wettability of the surface of an amorphous semiconductor film and to spread aqueous solution over an entire surface of the amorphous silicon film.

Subsequently, a heat treatment is performed at temperatures of from 500° C. to 550° C. for from 4 hours to 20 hours to crystallize the amorphous silicon film. In this embodiment, after forming a metal-containing layer by solution application with the use of nickel as the metal element, the metal-containing layer is introduced on the amorphous silicon film, and heat treatment is performed thereto at a temperature of 550° C. for four hours, thereby obtaining a first crystalline silicon film.

Next, the first crystalline silicon film is irradiated with laser beam to promote crystallization, and therefore a second crystalline silicon film is obtained. Laser crystallization is performed by irradiating laser beam to the semiconductor film. A solid-state laser, a gas laser, or a metal laser of continuous oscillation is preferable to be used for the laser crystallization. The solid-state laser includes: YAG laser, YVO$_4$ laser, YLF laser, YAlO$_3$ laser, glass laser, ruby laser, alexandrite laser, Ti:sapphire laser, and the like of continuous oscillation. The gas laser includes: Ar laser, Kr laser, CO$_2$ laser, and the like of continuous oscillation. The metal laser includes: helium cadmium laser, copper vapor laser, and gold vapor laser of continuous wave oscillation. Note that an excimer laser of continuous light emission can also be applied. The laser beam may be converted to higher harmonics by a nonlinear optical device. A crystal used for the nonlinear optical device such as LBO, BBO, KDP, KTP, KB5, and CLBO is superior in conversion efficiency. The conversion efficiency can be drastically increased by introducing such nonlinear optical device into a laser resonator. A laser of the higher harmonics is typically doped with Nd, Yb, Cr, and the like, and these are excited to oscillate laser beam. The type of a dopant may be appropriately selected by those who operate the present invention.

For example, the semiconductor film may be made of a material as follows: an amorphous semiconductor (hereinafter referred to as "AS") manufactured by vapor phase growth or sputtering with the use of semiconductor material gas represented by silane, germanium etc.; a polycrystalline semiconductor manufactured by crystallizing the amorphous semiconductor with the use of light energy, thermal energy etc.; a semi-amorphous (which is also referred to as a microcrystal) semiconductor (hereinafter referred to as "SAS"), and the like.

The SAS is a semiconductor which comprises an intermediate structure between an amorphous structure and a crystalline structure (including single crystal and poly crystal), and a third stable state in view of free energy. The SAS further includes a crystalline region having a short-range order along with lattice distortion. A crystalline region in a range of from 0.5 nm to 20 nm can be observed in a part of the region among the semi-amorphous semiconductor film. In the case where the semi-amorphous semiconductor film contains silicon as its principal constituent, the Raman spectrum is shifted to a lower wavenumber side than 520 cm$^{-1}$. The diffraction peak of (111) and (220), which is believed to be originated in a crystalline silicon lattice, is observed in the semi-amorphous semiconductor film by X-ray diffraction. Further, the semi-amorphous semiconductor film is added with at least 1 atom % of hydrogen or halogen as a naturalizing agent for dangling bonds. The SAS is formed by glow discharge decomposition with silicide gas (by plasma CVD). As for the silicide gas, in addition to $SiH_4$, $Si_2H_6$, $SiH_2Cl_2$, $SiHCl_3$, $SiCl_4$, $SiF_4$, and the like can be used. Furthermore, $GeF_4$ may be mixed in the above-mentioned gases for the silicide gas. The silicide gas may also be diluted in one or more rare gas elements selected from the group consisting of $H_2$, a mixture of $H_2$ and He, Ar, Kr, and Ne. The dilution ratio is in the range of 1:2 to 1:1,000. The pressure is approximately in the range of from 0.1 Pa to 133 Pa. The power supply frequency is in a range of from 1 MHz to 120 MHz, preferably 13 MHz to 60 MHz. The substrate heating temperature may be at most at 300° C. As for the impurity element in a film, respective concentrations of impurities of atmospheric constituents such as oxygen, nitrogen, or carbon are preferably set to $1\times10^{20}/cm^{-1}$ or less; in particular, the oxygen concentration is set to $5\times10^{19}/cm^3$ or less, more preferably, $1\times10^{19}/cm^3$ or less. Note that, a compound semiconductor film having an amorphous structure such as an amorphous silicon germanium film, and an amorphous silicon carbide film may also be employed.

The crystalline semiconductor film thus obtained is patterned by a patterning treatment using photolithography so as to form semiconductor layers 305 to 308.

After forming the semiconductor layers 305 to 308, minute amounts of impurity elements (boron or phosphorous) may be doped to control a threshold value of a TFT.

Subsequently, a gate insulating film 309 covering the semiconductor layers 305 to 308 is formed. The gate insulating film 309 is formed of an insulating film including silicon to have a thickness of from 40 nm to 150 nm by plasma CVD or sputtering. In this embodiment, a silicon oxynitride film is formed to have a thickness of 115 nm by plasma CVD. The material for the gate insulating film is not limited to the silicon oxynitride film, and other insulating films with a single layer structure or a laminated structure may be used.

Figures 8A, 8B, 8C:
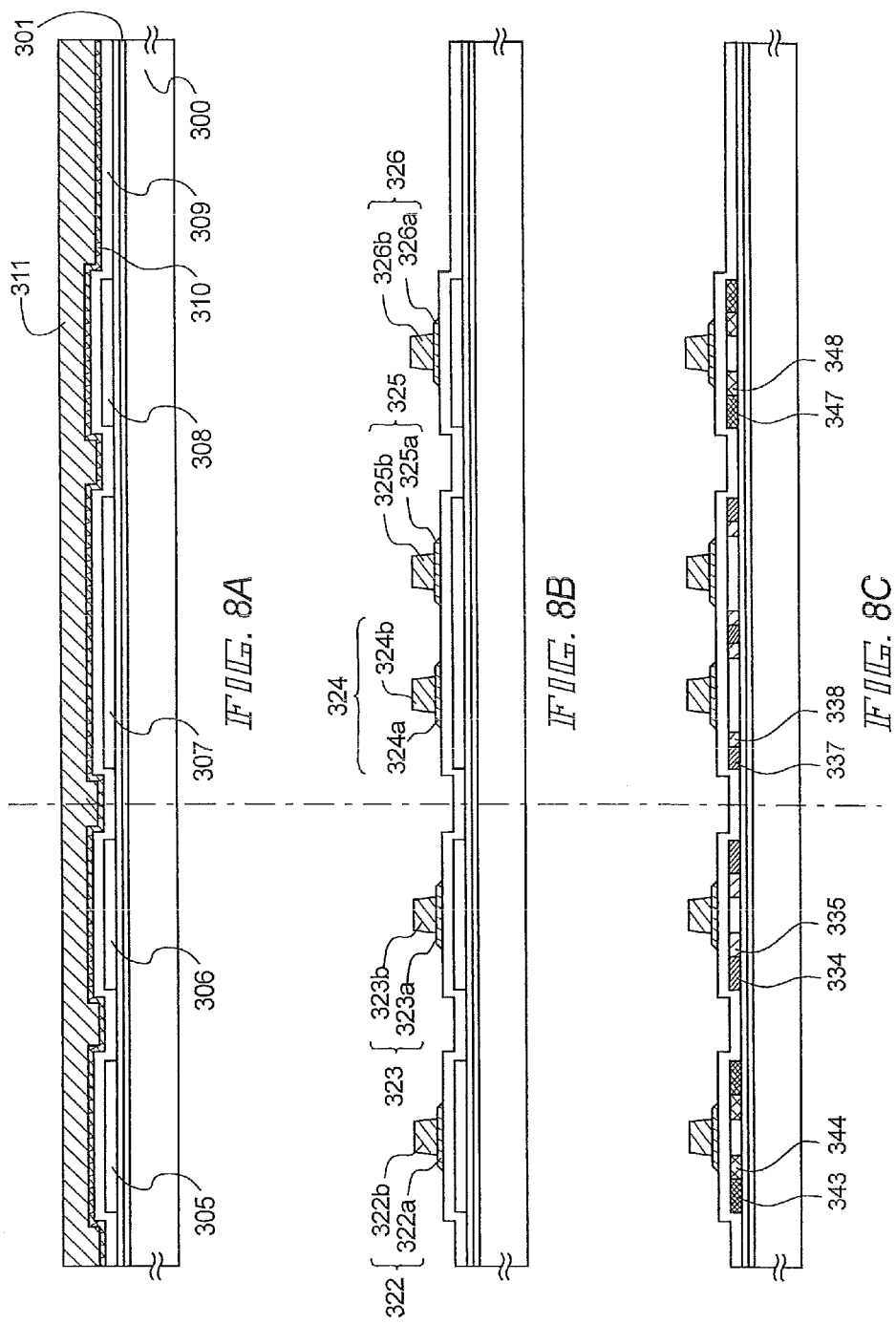
FIGS. 8A to 8C are cross sectional views showing steps for manufacturing an active matrix substrate.

A first conductive film with a film thickness of from 20 nm to 100 nm and a second conductive film with a film thickness of from 100 nm to 400 nm are formed and laminated over the gate insulating film. The first and the second conductive films may be made of an element selected from Ta, W, Ti, Mo, Al, and Cu, or an alloy material or a compound material having the foregoing element as a main component. A semiconductor film represented by a polycrystalline silicon film that is doped with an impurity element such as phosphorus or an AgPdCu alloy may be used as the first and the second conductive films. The conductive films are not limited to a two-layer structure, and, for example, a three-layer structure in which a 50-nm-thick tungsten film, a 500-nm-thick alloy (Al—Si) film of aluminum and silicon, and a 30-nm-thick titanium nitride film are sequentially laminated may be applied. In the case of the three-layer structure, tungsten nitride may be used as substitute for tungsten of the first conductive film; an alloy (Al—Ti) film of aluminum and titanium may be used as substitute for an alloy (Al—Si) film of aluminum and silicon of the second conductive film; or a titanium film may be used as substitute for a titanium nitride film of a third conductive film. Further, a single layer structure may also be applied. In this embodiment, a tantalum nitride film 310 of 30 nm in thickness and a tungsten film 311 of 370 nm in thickness are sequentially laminated over the gate insulating film 309 (FIG. 8A).

Next, a mask comprising a resist is formed by photolithography, and a first etching treatment is performed to form an electrode and a wiring. The first conductive film and the second conductive film can be etched into a desired tapered shape by appropriately adjusting etching conditions (such as electric energy applied to a coil-shaped electrode, electric energy applied to an electrode on a substrate side, and temperature of the electrode on the substrate side) with the used of ICP (Inductively Coupled Plasma) etching. For an etching gas, a chlorine-based gas typified by $Cl_2$, $BCl_3$, $SiCl_4$, $CCl_4$ and the like; a fluorine-based gas typified by $CF_4$, $SF_6$, $NF_3$ and the like; or $O_2$ can be appropriately used.

A first-shape conductive layer (a first conductive layer and a second conductive layer) comprising the first conductive layer and the second conductive layer is formed by the first etching treatment.

Subsequently, a second etching treatment is performed without removing a mask made of resist. Here, a W film is etched selectively. Then, the second conductive layers 322b to 326b are formed by the second etching treatment. On the other hand, the first conductive layers 322a to 326a are hardly etched, and second-shape conductive layers 322 to 326 are formed (FIG. 8B).

An impurity element imparting n-type conductivity is added to the semiconductor layer in low concentration by performing a first doping treatment without removing the mask made of the resist. The doping treatment may be performed by ion doping or ion implantation. An element belonging to Group 15 in the periodic table, typically phosphorus (P) or arsenic (As) is used for the impurity element imparting n-type conductivity, and phosphorus (P) is used here. In this case, the second-shape conductive layers 322 to 326 serve as masks for preventing the impurity element imparting n-type conductivity from being doped into the semiconductor layer, and an impurity region is formed in a self-aligning manner. The impurity region is doped with the impurity element imparting n-type conductivity in a concentration range of from $1\times10^{18}$ atoms/cm$^3$ to $1\times10^{20}$ atoms/cm$^3$.

After removing the mask made of the resist, another mask made of a resist is newly formed, and a second doping treatment is performed at a higher accelerating voltage than the first doping treatment. The second doping treatment is performed by using the second conductive layers 323b and 326b as masks for preventing the impurity element from doping into the semiconductor layer so as to add the impurity element to the semiconductor layer below the tapered portion of the first conductive layers 322a to 326a. Subsequently, a third doping treatment is performed at a lower accelerating voltage than the second doping treatment. According to the second doping treatment and the third doping treatment, a lower concentration impurity region 335 overlapping the first conductive layer is added with the impurity element imparting n-type conductivity in a concentration range of from $1\times10^{18}$ atoms/cm$^3$ to $5\times10^{19}$ atoms/cm$^3$, and higher concentration impurity regions 334 and 337 are added with the impurity element imparting n-type conductivity in a concentration range of from $1\times10^{19}$ atoms/cm$^3$ to $5\times10^{21}$ atoms/cm$^3$.

Of course, the lower concentration impurity region and the higher concentration impurity regions can be formed by once doping treatment with a combination of the second doping treatment and the third doping treatment by setting an accelerating voltage appropriately.

Next, after removing the mask made of the resist, still another mask made of a resist is newly formed, and a fourth doping treatment is carried out. According to the fourth doping treatment, impurity regions 343, 344, 347, and 348 that are added with an impurity element imparting a conductivity type opposite to the previously doped conductivity type are formed in the semiconductor layers to be active layers of a p-channel TFT. The impurity regions are formed in a self-aligning manner by using the second-shape conductive layers 322 and 326 as masks for preventing the impurity element from doping into the semiconductor layer and by adding an impurity element imparting p-type conductivity. In this embodiment, the impurity regions 343, 344, 347, and 348 are formed by ion doping using diborane ($B_2H_6$). In the case of the fourth doping treatment, a semiconductor layer forming an n-channel TFT is covered with the mask made of the resist. According to the first to third doping treatments, the impurity regions are doped with phosphorus in different concentrations, respectively. However, any problems do not arise since the impurity regions function as a source region and a drain region of a p-channel TFT by carrying out the doping treatments so as to have a concentration of an impurity element imparting p-type conductivity of from $1\times10^{19}$ atom s/cm$^3$ to $5\times10^{21}$ atoms/cm$^3$.

According to the above-described steps, the impurity regions are formed in each semiconductor layer (FIG. 8C).

Subsequently, the mask comprising the resist is removed, and an insulating film 349 is formed as a passivation film. The insulating film 349 is formed of an insulating film including silicon with a thickness of from 100 nm to 200 nm by plasma CVD or sputtering (FIG. 9A). Of course, the insulating film 349 is not limited to a silicon oxynitride film, and other insulating films including silicon, and having a single layer structure or a laminated structure may be adopted. In this embodiment, a silicon oxynitride film of 150 nm in thickness is formed by plasma CVD.

Moreover, a step of hydrogenating the semiconductor layers is performed by heat treatment at temperatures of from 300° C. to 550° C. for 1 hour to 12 hours under a nitrogen atmosphere. The step is preferably performed at temperatures of from 400° C. to 500° C. The step is a step for terminating dangling bonds of the semiconductor layers due to hydrogen contained in the first insulating film 349. In this embodiment, the heat treatment is performed at 410° C. for one hour.

The insulating film 349 is formed of a material selected from silicon nitride, silicon oxide, silicon oxynitride (SiON), silicon nitride oxide (SiNO), aluminum nitride (AlN), aluminum oxynitride (AlON), aluminum nitride oxide having more nitrogen content than oxygen content (AlNO), aluminum oxide, diamond like carbon (DLC), and a carbon nitride (CN) film.

In the present invention, a silicon oxynitride (SiON) film denotes a film containing Si of from 25 atom % to 35 atom %, oxygen of from 55 atom % to 65 atom %, nitrogen of from 1 atom % to 20 atom %, and hydrogen of from 0.1 atom % to 10 atom %. Meanwhile, a silicon nitride oxide (SiNO) film denotes a film including Si of from 25 atom % to 35 atom %, oxygen of from 15 atom % to 30 atom %, nitrogen of from 20 atom % to 35 atom %, and hydrogen of from 15 atom % to 25 atom %.

In order to activate the impurity element, heat-treatment, irradiation of intense light, or irradiation of laser beam may be carried out. Simultaneously with the activation, plasma damage in the gate insulating film or plasma damage in an interface between the gate insulating film and the semiconductor layer can be repaired.

An interlayer film 350 containing an organic resin material is formed on the insulating film 349. As the interlayer film 350, a film comprising one kind of or plural kinds of materials selected from inorganic materials (such as silicon oxide, silicon nitride, silicon oxynitride, and silicon nitride oxide) and photosensitive or nonphotosensitive organic materials (or organic resin materials) (such as polyimide, acrylic, polyimide, polyimide amide, resist, benzocyclobutene, and siloxane polymer), or a laminated layer of these and the like can be used. Further, a negative type photosensitive organic material that becomes insoluble in etchant by photosensitive light, and a positive type photosensitive organic material that becomes soluble in etchant by light, can be also used as the interlayer film. In this embodiment, the interlayer film 350 is made of a positive photosensitive acrylic that is the photosensitive organic resin material. A curved surface having a curvature radius (0.2 μm to 3.0 μm) only in an upper edge portion of the interlayer film is preferably provided in the case of using the positive photosensitive acrylic. Thereafter, a passivation film made of the following materials may be formed on the interlayer film 350: silicon nitride; silicon oxide; silicon oxynitride (SiON); silicon nitride oxide (SiNO); aluminum nitride (AlN); aluminum oxynitride (AlON); aluminum nitride oxide having more nitrogen content than oxygen content (AlNO); aluminum oxide; diamond like carbon (DLC); a carbon nitride (CN) film; or siloxane polymer.

Subsequently, the interlayer film 350, the insulating film 349, and the gate insulating film 309 are etched to form openings that are in contact with a source region and a drain region. In order to form the openings, the insulating film 349 and the gate insulating film may be etched by newly forming a mask after etching the interlayer film or by using the etched interlayer film 350 as the mask. Then, a metal film is formed and etched so as to form a source electrode or drain electrode 352, and each wiring (not shown) for electrically connecting to each impurity region, respectively. The metal film may be made of a film comprising an element of aluminum (Al), titanium (Ti), molybdenum (Mo), tungsten (W), or silicon (Si), or an alloy film comprising these elements. In this embodiment, after laminating a titanium film/a silicon-aluminum alloy film/a titanium film (Ti/Si—Al/Ti) to be 100 nm/350 nm/100 nm in thickness respectively, the source electrode or drain electrode 352 and each wiring (not shown) are formed by patterning and etching the laminated film into a desired shape.

In this embodiment, after forming the interlayer film 350, an opening 1018 connecting to the substrate 300 is formed in a sealing region. A protective film 1019 is formed so as to cover the opening 1018. The protective film 1019 and the source electrode or drain electrode 352 are made of the same material through the same processing step.

Subsequently, a pixel electrode 353 is formed. In this embodiment, a transparent conductive film is formed and etched into a predetermined shape to form the pixel electrode 353 (FIG. 8B).

As for the transparent conductive film, for example, a compound of indium oxide and tin oxide, a compound of indium oxide and zinc oxide, zinc oxide, tin oxide, or indium oxide can be used. A transparent conductive film doped with gallium may also be used. The pixel electrode 353 may be formed on a flat interlayer insulating film prior to the formation of the above-mentioned wirings. It is effective to planarize a step due to a TFT by using a planarizing film comprising resin. Since an EL layer to be formed later is very thin, the step may cause a defect in light emission. Consequently, the step is preferably leveled before forming the pixel electrode so as to form the EL layer on a surface as smooth as possible.

According to the above-described steps, an active matrix substrate comprising a TFT is completed. In this embodiment, the active matrix substrate comprises a double gate structure in which two channel formation regions are formed in the n-channel TFT of the pixel region. Furthermore, the active matrix substrate may comprise a single gate structure having one channel formation region or a triple gate structure having three channel formation regions. Although a TFT for the driving circuit portion comprises a single gate structure in this embodiment, the TFT may have a double gate structure or a triple gate structure.

Not limited to a method for manufacturing a TFT described in this embodiment, the present invention can be applied to a top gate type (planar type), a bottom gate type (inversely staggered type), or a dual gate type having two gate electrodes disposed above and below a channel region while interposing a gate insulating film therebetween.

Figure 10:
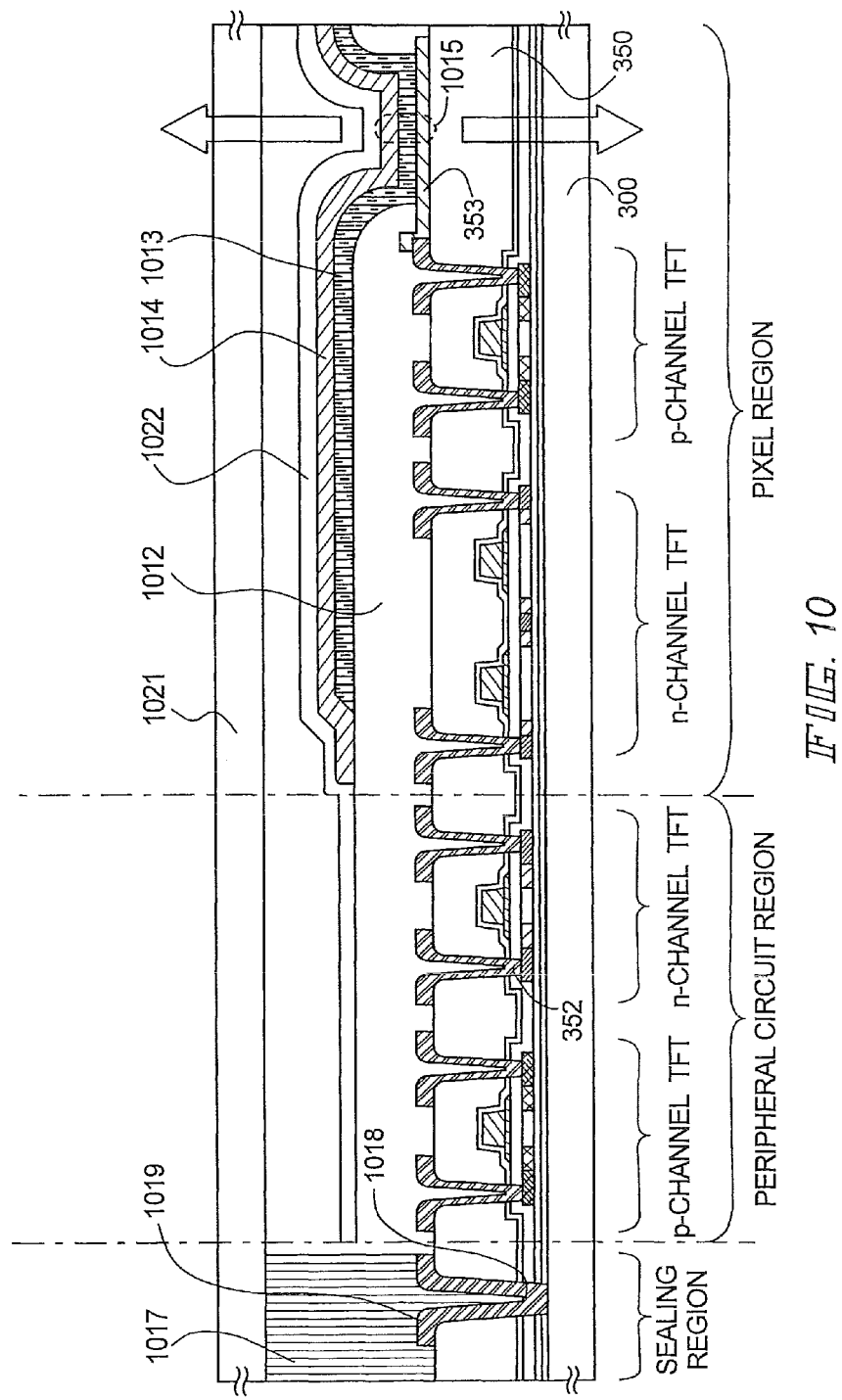
FIG. 10 is a cross sectional view of a display device according to the present invention.

As shown in FIG. 10, an insulator 1012 is formed after forming the pixel electrode 353. The insulator 1012 may be formed by patterning an insulating film or an organic resin film including silicon with a thickness of from 100 nm to 400 nm.

Since the insulator 1012 is an insulating film, electrostatic discharge damage to a device in deposition needs attention. In this embodiment, the resistivity is reduced by adding a carbon particle or a metal particle into an insulating film to be a material of the insulator 1012, thereby suppressing generation of static electricity. At this time, the amount of a carbon particle or a metal particle to be added may be adjusted such that the resistivity becomes from $1\times10^6$ $\Omega$m to $1\times10^{12}$ $\Omega$m (preferably from $1\times10^8$ $\Omega$m to $1\times10^{10}$ $\Omega$m).

An EL layer 1013 is formed on the pixel electrode 353. Only one pixel is shown in FIG. 10; however, in this embodiment, EL layers corresponding to respective colors of R (red), G (green), and B (blue) are formed separately. In this embodiment, a low molecular weight organic light-emitting material is formed by vapor deposition. Specifically, the EL layer has a laminated structure having a copper phthalocyanine (CuPc) film provided with a thickness of 20 nm as the hole injecting layer and a tris-8-quinolinolato aluminum complex ($Alq_3$) film provided thereupon with a thickness of 70 nm as the EL layer. Colors of light emission can be controlled by adding fluorescent dye such as quinacridone, perylene, or DCM 1 to $Alq_3$.

However, the foregoing example is one example of the organic light-emitting material, which can be used as the EL layer and the organic light-emitting material is not necessarily limited thereto. The EL layer (layer for light emission and for carrier movement for the light emission) may be formed by freely combining the EL layer, the charge transporting layer, and the charge injecting layer. Although the example in which the low molecular weight organic light-emitting material is used as the EL layer is described in this embodiment, for example, an intermediate molecular weight organic light-emitting material or a high molecular weight organic light-emitting material may be used as substitute for the low molecular weight organic light-emitting material. Throughout the present specification, an organic light-emitting material which does not sublimate and has molecularity of equal to or less than 20 or a molecular chain length of equal to or less than 10 μm is defined as the intermediate molecular weight organic light-emitting material. In addition, as an example of using the high molecular weight organic light-emitting material, a laminated structure having a polythiophene (PEDOT) film provided by spin coating with a thickness of 20 nm as the hole injecting layer and a paraphenylene-vinylene (PPV) film with a thickness of approximately 100 nm provided thereupon as the EL layer may be given. In addition, emission wavelength can be selected from red through blue by using n-conjugated polymer of PPV. An inorganic material such as silicon carbide can be used for the charge transporting layer and the charge injecting layer. These organic light-emitting materials and inorganic materials can be made of known materials.

Next, a cathode 1014 comprising a conductive film is provided on the EL film 1013. The cathode 1014 may be made of a material having lower work function (for example, Al, Ag, Li, and Ca, or alloy of these elements such as MgAg, MgIn, AlLi, $CaF_2$, and CaN). In the present embodiment, the cathode 1014 is formed by laminating a thin metal film (MgAg: 10 nm in thickness), a 110-nm-thick transparent conductive film (such as ITO (indium tin oxide alloy), indium zinc oxide alloy, zinc oxide, tin oxide, and indium oxide) such that light generated in the EL layer passes through the cathode.

An EL element 1015 is completed at the time of forming up to the cathode 1014. The EL element 1015 is made of the pixel electrode (anode) 353, the EL layer 1013, and the cathode 1014.

It is effective to provide a passivation film 1022 so as to completely cover the EL device 1015. The passivation film is made of an insulating film including an element as follows: silicon nitride; silicon oxide; silicon oxynitride (SiON); silicon nitride oxide (SiNO); aluminum nitride (AlN); aluminum oxynitride (AlON); aluminum nitride oxide (AlNO) containing more nitrogen content than oxygen content; aluminum oxide; diamond like carbon (DLC); a carbon nitride film (CN); or siloxane polymer. The passivation film may be formed by the single-layer insulating film or a laminated layer of these insulating films.

In such the case, a film favorable in coverage is preferably used as the passivation film. It is effective to use a carbon film, particularly a DLC film. Since the DLC film can be formed in a temperature range of from room temperature to equal to or less than 100° C., the DLC film can be easily formed above the EL layer 1013 having low heat resistance. The DLC film has a high blocking effect to oxygen and can suppress oxidization of the EL layer 1013. Consequently, a problem of oxidation of the EL layer 1013 during the following sealing step can be avoided.

According to the embodiment, in the sealing region, the sealing material 1017 is applied on the protective film 1019 so as to fill the depressions generated due to the openings, thereby adhering (bonding) the substrate 300 and the covering material 1021. In this embodiment, the protective film 1019 and the wirings are made of the same material through the same step.

The material for a sealing material 1017 is not particularly limited, and the sealing material is preferably made of typical visible light curable resin, ultraviolet curable resin, or thermal curable resin. In this embodiment, thermal curable epoxy resin is used for the sealing material 1017. Further, the covering material 1021 is made of a glass substrate, a quartz substrate, a plastic substrate (including a plastic film), or a flexible substrate with carbon films (more preferably, a DLC film or a CN film) formed on each surface thereof. Aluminum films (such as AlON, AlN, and AlO), SiN, and the like can be used as well as the carbon films.

Figure 15:
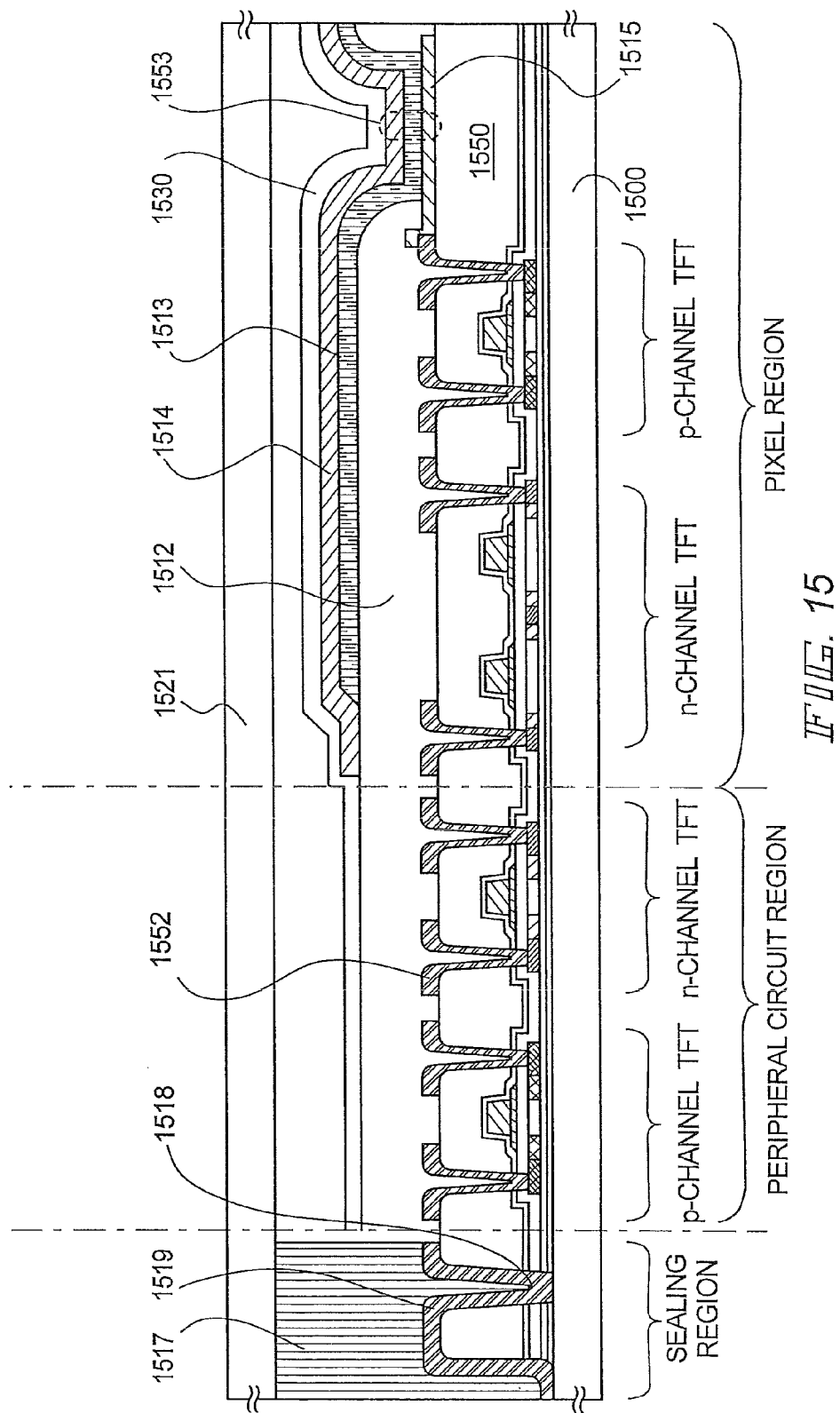
FIG. 15 is a cross sectional view showing a display device according to the present invention.

Thus, a dual emission display device, which can emit light in an upward direction and a downward direction, having a structure as shown in FIG. 10 is completed. A region in which the edge portion of the insulating layer of the display device is exposed in FIG. 10 is covered with the protective film 1019 in FIG. 15. In FIG. 15, reference numeral 1500 is a substrate, reference numeral 1550 is an interlayer insulating film, reference numeral 1552 is an electrode, reference numeral 1512 is an insulating film, reference numeral 1515 is a pixel electrode, reference numeral 1513 is an EL layer, reference numeral 1514 is a cathode, reference numeral 1553 is an EL element, and reference numeral 1530 is a passivation film. In a sealing region, an opening portion 1518 is formed at the side of the substrate 1500, and the opening portion 1518 is covered with a protective film 1519. The substrate 1500 and a cover member 1521 are adhered with each other by a sealing member 1517. In FIG. 15 of the present invention, the openings and the edge portion of the insulating layer are covered with the same protective film 1519. However, each opening and the edge portion of the insulating layer may be covered with different protective films, respectively. According to the structure in FIG. 15, intrusion of the contaminants into the interior of the display device can be further prevented, thereby enhancing the reliability of the display device.

It is effective to continuously carry out the steps of up to forming the passivation film after forming the insulator 1012 by using a deposition apparatus having a multi-chamber system (or an in-line system) without exposure to the atmosphere. In addition, with further development, the steps of up to sealing with the covering material 1021 can be carried out without exposure to the atmospheric air.

By providing an impurity region overlapping a gate electrode with an insulating film therebetween, an n-channel TFT resistive to deterioration resulting from a hot-carrier effect can be formed. Consequently, a semiconductor device with high reliability can be realized.

In this embodiment, only a structure of a pixel portion and a driving circuit is shown. However, according to the manufacturing steps in this embodiment, logic circuits such as a signal division circuit, a D/A converter, an operation amplifier, and a α-correction circuit can be also formed on the same insulator. Furthermore, a memory or a microprocessor can be formed thereon.

In this embodiment, the opening 1018 is formed in the insulating layer including the organic resin material and the surface thereof is covered with the protective film 1019. Therefore, the insulating layer that becomes a path for the contaminants is isolated, which prevents the contaminants from penetrating into a display element. In the case where the protective film 1019 is made of a conductive film, it is necessary to design a portion to be covered with the protective film by a mask etc. so as to prevent a short circuit inside the display device. As shown in FIG. 4, when the insulating layer is isolated by the protective film with a laminated structure for covering the openings, the effect of blocking the contaminants is further improved as compared with the case of using the protective film with a single layer.

According to the present invention, the path for moisture, which is the insulating layer containing the organic resin material of the display device is shut out. As a result, it is possible to prevent moisture and oxygen exist outside of the display device from penetrating into a display element inside the display device via the insulating film having a hygroscopic organic material and the like. Therefore, various deteriorations caused by moisture and oxygen such as contamination of the interior of the display device, deterioration in the electric characteristics, a dark spot, and shrinkage can be prevented, thereby enhancing the reliability of the display device. In addition, since a film made of the same material as the film constituting the display device is used as the protective film for covering the openings, a display device with high reliability can be manufactured without increasing the number of the steps.

Embodiment 2

In Embodiment 2, an example of a display device manufactured according to Embodiment 1, which has a different structure in a sealing region from that in Embodiment 1, will be described with reference to FIG. 11.

Figure 11:
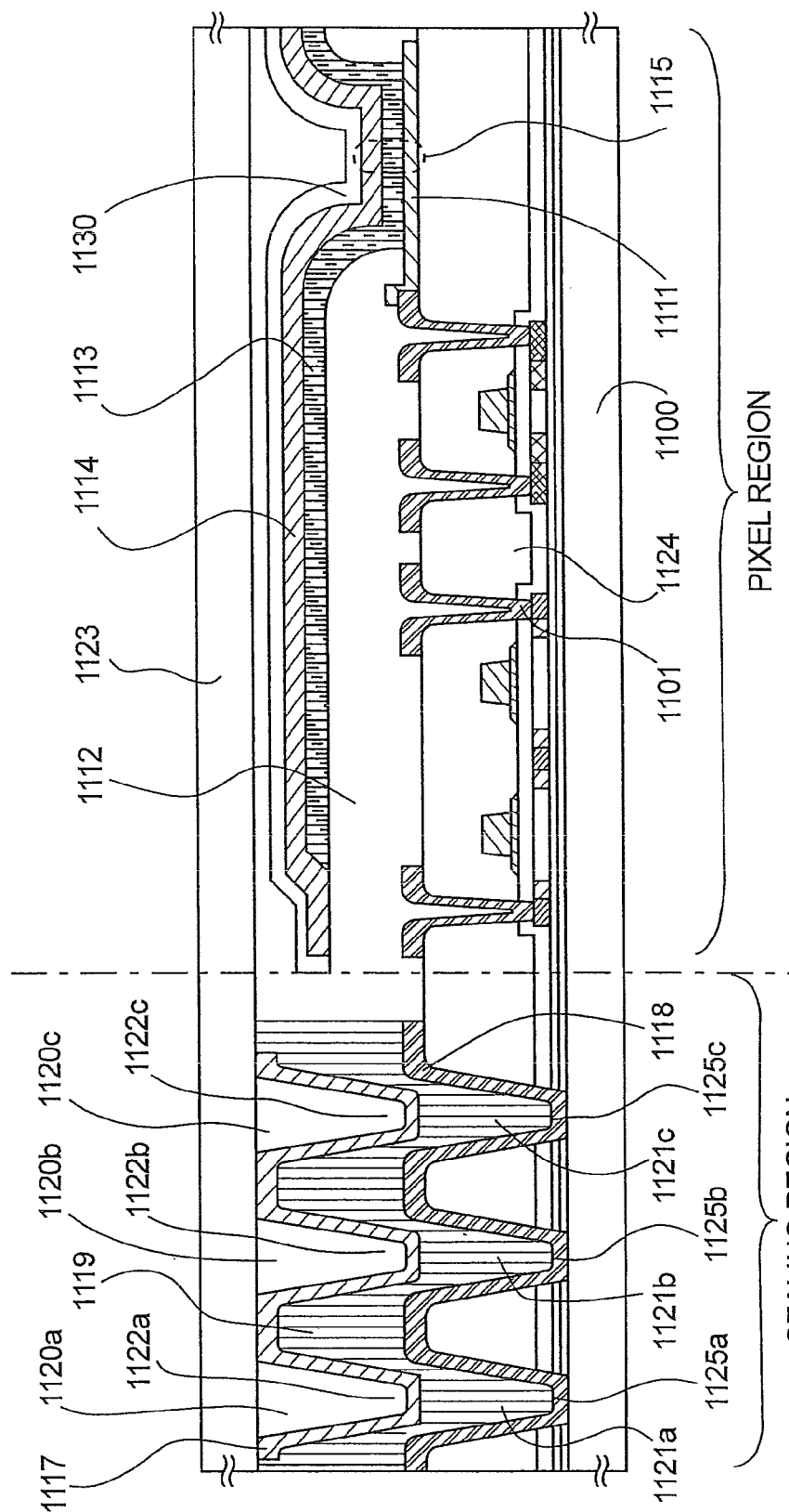
FIG. 11 is a cross sectional view of a display device according to the present invention.

In FIG. 11, reference numeral 1100 denotes a substrate, reference numeral 1101 denotes an electrode, reference numeral 1111 denotes a pixel electrode, reference numeral 1112 is an insulating film, reference numeral 1113 denotes an EL layer, reference numeral 1114 denotes a cathode, reference numeral 1115 denotes an EL element, and reference numeral 1130 denote a passivation film. In a sealing region, depressions 1121a, 1121b and 1121c are formed at the side of the substrate 1100 by openings 1125a, 1125b, and 1125c and a protective film 1118 for covering the openings. At the side of the covering material 1123, projections 1122a, 1122b, and 1122c are formed by insulators 1120a, 1120b, and 1120c, and another protective film 1117 for covering the insulators. The substrate 1100 having the depressions and the covering material 1123 having the projections are adhered to each other so as to face each depression and each projection.

In this embodiment, the protective film 1118 and the electrode 1101 are made of a same material through same steps. The protective films 1118 and 1117 may be made of one kind or plural kinds of films selected form thin conductive films and thin insulating films. As for the thin conductive films, a film made of one or more elements selected from Al, Ti, MO, W, and Si may be used. As for the thin insulating film, a film composed of one or more materials selected from silicon nitride, silicon oxide, silicon nitride oxide, aluminum nitride, aluminum oxynitride, aluminum nitride oxide, aluminum oxide, diamond like carbon (DLC), a carbon nitride (CN) film, and siloxane polymer may be used.

An interlayer film 1124 may be made of a film comprising one kind or plural kinds of materials selected from inorganic materials (such as silicon oxide, silicon nitride, silicon oxynitride, and silicon nitride oxide) and photosensitive or nonphotosensitive organic resin materials (such as polyimide, acrylic, polyamide, polyimide amide, resist, benzocyclobutene, and siloxane polymer), or a laminated layer of these and the like. In this embodiment, the interlayer film 1124 is made of photosensitive acrylic.

In this embodiment, in order to form the projections at the side of the covering material, the insulators (also referred to as banks, partition walls, barriers, embankments etc.) 1120a, 1120b, and 1120c and the protective film 1117 are laminated. However, the present invention is not limited to the laminated structure. The projections may be formed by a single layer structure or a laminated structure comprising four or more layers, or by processing the covering material. The covering material may be processed by mechanically cutting the covering material in accordance with the material of the covering material, or by dry etching or wet etching to form the projections. When the projections are formed by using a film at the side of the covering material, the material for the projections is not particularly limited, and the above-mentioned materials used for the protective film and the interlayer film may be used. In this embodiment, the insulators 1120a, 1120b, and 1120c are made of the photosensitive acrylic which is an organic resin material, whereas the protective film 1117 is made of a silicon nitride film.

The depressions 1121a, 1121b, and 1121c in the sealing region are formed so as to contact with the substrate in this embodiment. Alternatively, these depressions may be formed until they contact with a dense base film. The openings may be formed in a hydrophilic film, which serves as a path for moisture, and hence, the depth of each opening may be set arbitrarily. Although the openings may be covered with a single-layer protective film in this embodiment, the openings may also be covered with a laminated protective film in which plural films are laminated.

Since the depressions formed over the substrate 1100 and the projections formed over the covering material 1123 are formed so as to match with each other, a sealing material sandwiched therebetween is pressed, extended, and adhered to a gap between the depressions and projections. Accordingly, when minute amounts of moisture and oxygen penetrate through the sealing material, such contaminants hardly intrude into the interior of the display device since the contaminants have to move along a long zigzag path due to the depressions and projections.

Figure 16:
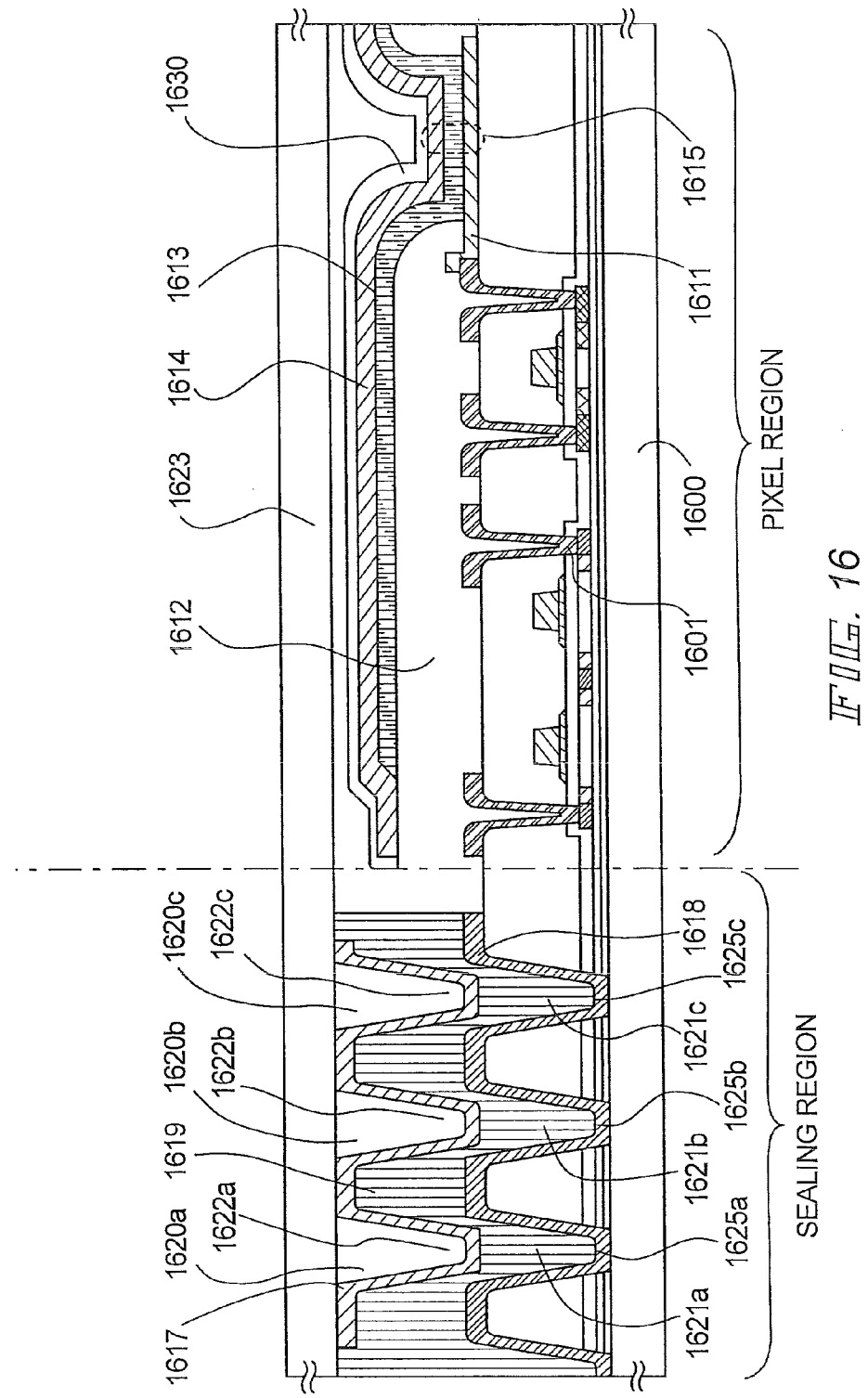
FIG. 16 is a cross sectional view of a display device according to the present invention.

Meanwhile, as illustrated in FIG. 16, a portion in which the edge portion of the insulating layer of the display device in this embodiment is exposed, is covered with the protective film 1118. In FIG. 16, reference numeral 1600 is a substrate, reference numeral 1601 is an electrode, reference numeral 1611 is a pixel electrode, reference 1612 is an insulating film, reference numeral 1613 is an EL layer, reference numeral 1614 is a cathode, reference numeral 1615 is an EL element, and reference numeral 1630 is a passivation film. In a sealing region, depressions 1621a, 1621b and 1621c are formed at the side of the substrate 1600 by openings 1625a, 1625b, and 1625c and a protective film 1618 for covering the openings. At the side of the covering material 1623, projections 1622a, 1622b, and 1622c are formed by insulators 1620a, 1620b, and 1620c, and another protective film 1617 for covering the insulators. The substrate 1600 having the depressions and the covering material 1623 having the projections are adhered to each other by a sealing member 1619 so as to face each depression and each projection. In this embodiment, a region between the openings and the edge portion of the insulating layer is covered with the same protective film 1617 and 1618. However, the openings and the edge portion of the insulating layer may be covered with different protective films, respectively. According to the structure in FIG. 15, intrusion of the contaminants into the interior of the display device can be further prevented, thereby enhancing the reliability of the display device.

According to the present invention, even if moisture and oxygen penetrate through the sealing material and the interlayer film 1124 made of acrylic etc., which is exposed to the atmospheric air, since moisture and oxygen are shut out by the protective film, an EL element and TFTs informed inside the display device can be protected. As a result, deterioration of an EL display device due to moisture and oxygen can be prevented. When a plurality of protective films are laminated, the function of blocking the contaminants such as moisture can be further improved, thereby obtaining a display device with higher reliability.

Although the foregoing structure of the sealing region is applied to the case of the EL display device in this embodiment, the structure of the sealing region of the present invention can also be applied to a liquid crystal display device. In the case of the liquid crystal display device, a display device in which a display portion is formed of a liquid crystal as substitute for the EL element may be manufactured by utilizing the structure of the sealing region according to the present invention.

Embodiment 3

In Embodiment 3, an arrangement of wirings formed around the periphery of a display device will be described with reference to FIG. 17. In this embodiment, a protective film and the wirings are made of a same material through same steps.

Figure 5:
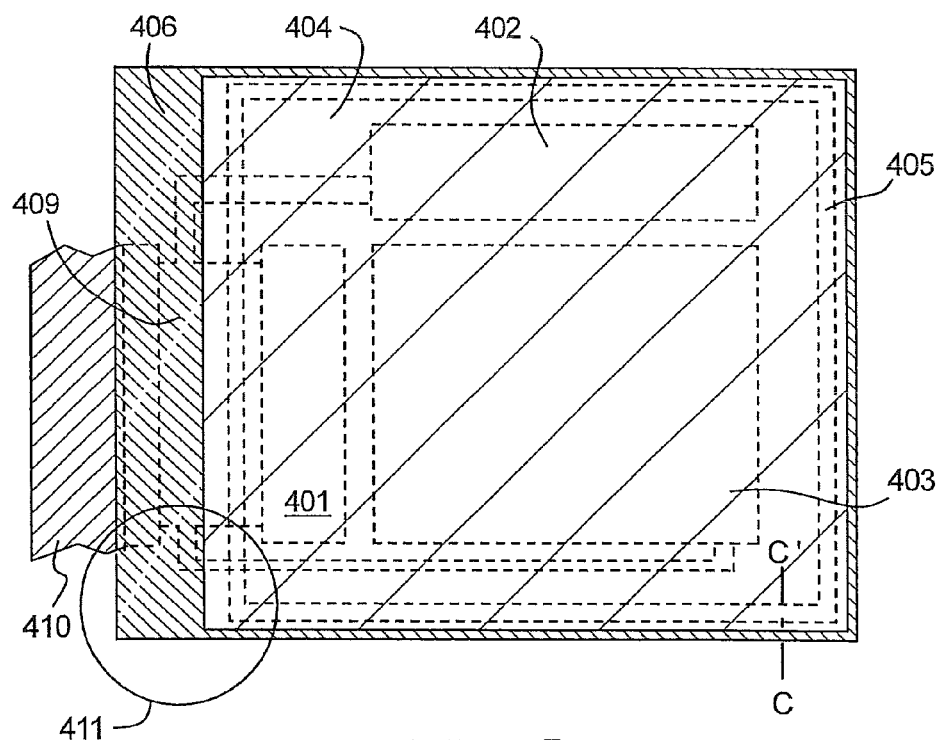
FIG. 5 is a diagram showing a conventional structure.
Figure 6:
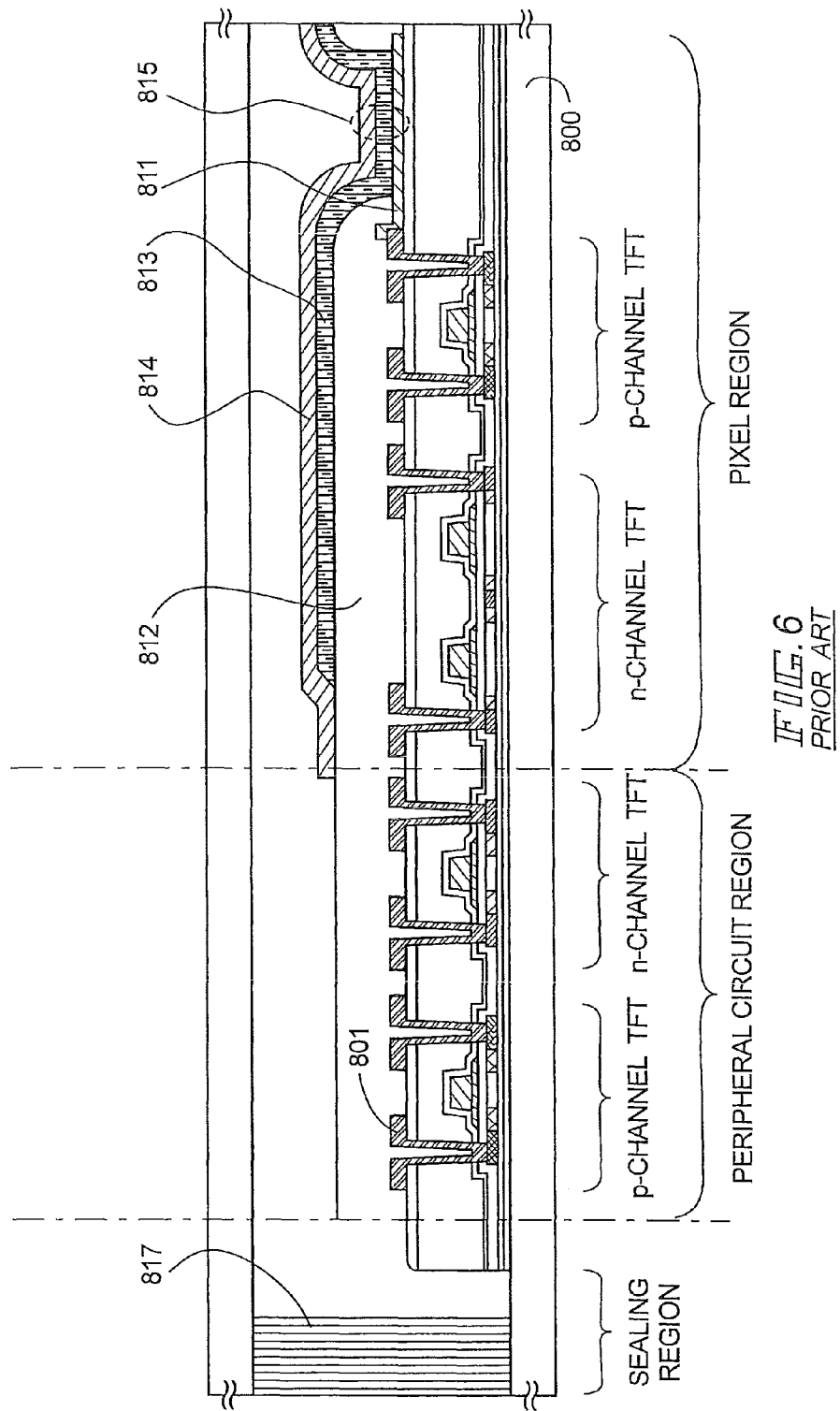
FIG. 6 is a cross sectional view of a conventional EL display device.
Figure 7:
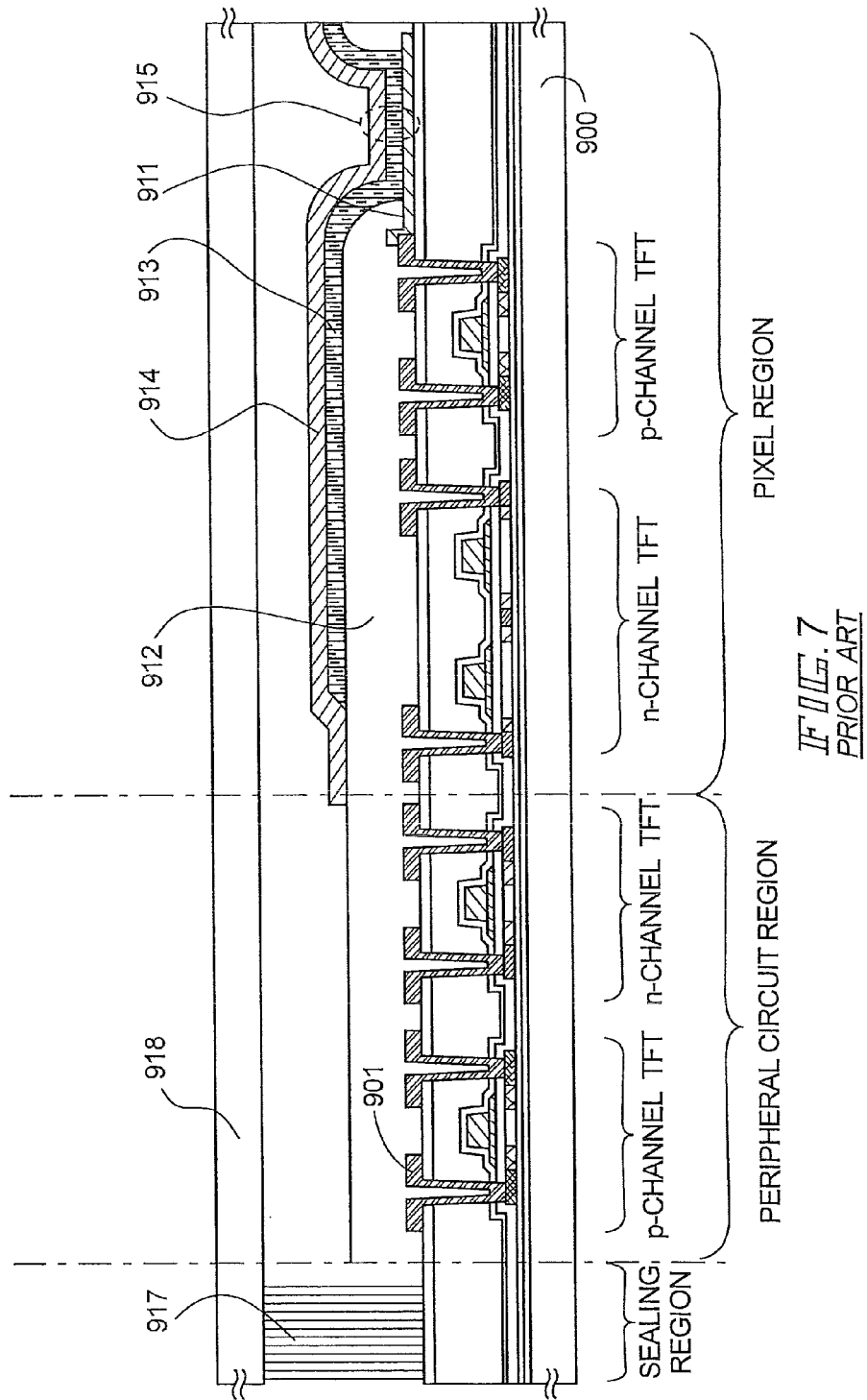
FIG. 7 is a cross sectional view of a conventional EL display device.

In FIG. 5, in a portion 411 surrounded by a circle, the wirings for a pixel portion are connected to a FPC (flexible printed circuit). The arrangement of the wirings of the display device according to the present invention is depicted in FIG. 17. A first anode 2202 having an outermost wiring connected to the FPC is arranged in the outmost edge of the device, whereas a cathode 2201 is arranged in the innermost edge of the device. Subsequently, a sealing material is formed so as to cover a connection portion between the outermost first anode 2202 and the FPC. The periphery of the display device comprises a first region with the first anode formed thereon and a second region where is the connection portion between the wirings and the FPC. In this embodiment, the second region resides in one side of the periphery of the display device composed of four sides, whereas the first regions reside in the other three sides thereof.

Figure 18:
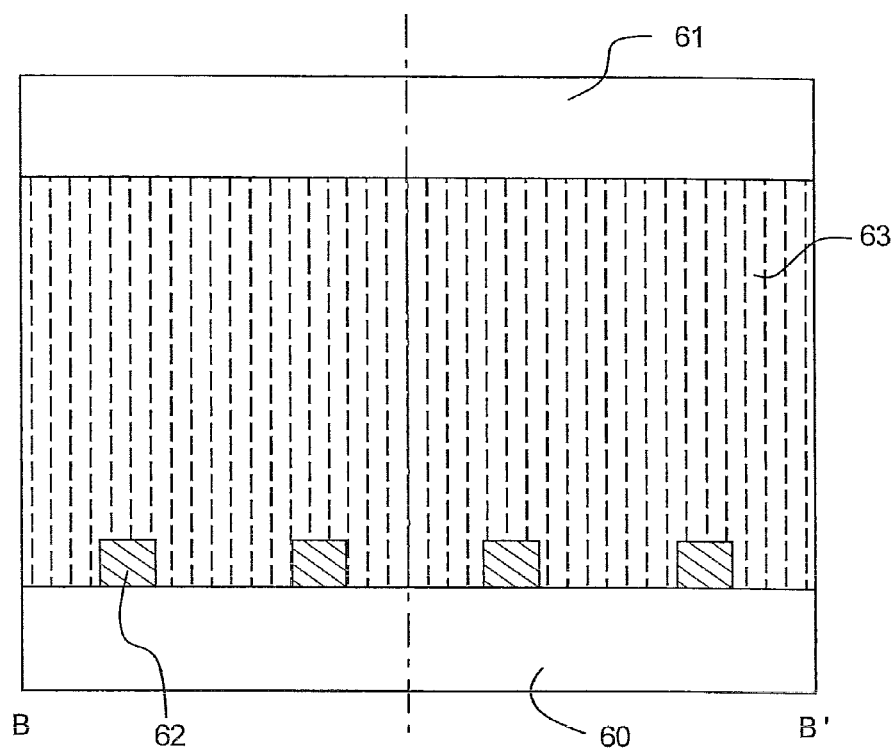
FIG. 18 is a cross sectional view of a display device according to the present invention.

FIG. 18 shows a cross sectional view taken along a like B-B' of the display device in FIG. 17. An electrode 62 connected to the FPC is formed on a substrate 60, and the sealing material 63 is formed thereon. A film such as an interlayer film including an organic resin material underneath the electrode, which is connected to the FPC, is removed by etching and the like in advance, and an insulating layer including the organic resin material etc. is not exposed to the outer portion. Therefore, in the edges of the display device, the insulating layer including the organic resin material underneath the sealing material is perfectly protected from the outside air with the protective film made of the same material as the anodes, and the sealing material. In the display device according to the present invention, the peripheral edges thereof can be completely covered with no space, thereby blocking moisture sufficiently.

With respect to the arrangement of the wirings, an outermost wiring may be connected to the other wiring such as the FPC at the outmost portion, and the kind, polarity, and number of the wirings may be arbitrarily selected.

Embodiment 4

Various display devices (such as an active matrix display device, and an active matrix EC display device) can be manufactured by applying the present invention. That is, the present invention can be applied to various electronic equipment in which such display devices are incorporated in display portions.

The following can be given as such electronic equipment: a video camera; a digital camera; a projector; a head mounted display (a goggle type display); a car navigation system; a car stereo; a personal computer; a mobile information terminal (such as a mobile compute; a cellular phone, and an electronic book); and the like. Examples of the electronic equipment are illustrated in FIGS. 12A to 12F, and 13A to 13C.

Figure 12A:
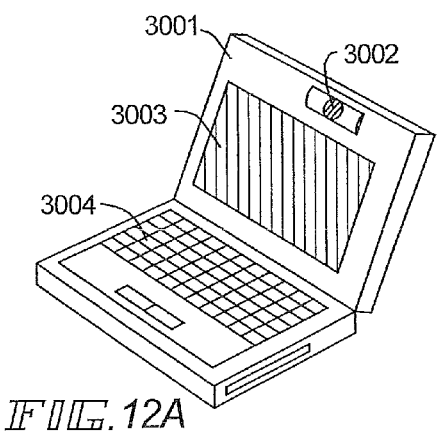
FIGS. 12A to 12F are diagrams showing examples of a display device.

FIG. 12A is a personal computer including a main body 3001, an image input portion 3002, a display portion 3003, a keyboard 3004, and the like. The personal computer of the present invention is completed by applying the present invention to the display portion 3003.

Figure 12B:
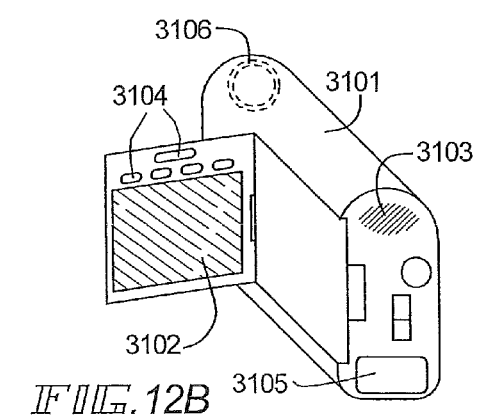

FIG. 12B is a video camera including a main body 3101, a display portion 3102, a voice input portion 3103, operation switches 3104, a battery 3105, an image receiving portion 3106, and the like. The video camera of the present invention is completed by applying the display device manufactured according to the present invention to the display portion 3102.

Figure 12C:
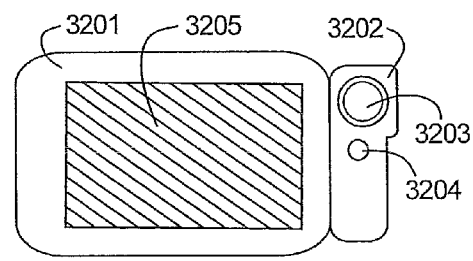

FIG. 12C is a mobile computer including a main body 3201, a camera section 3202, an image receiving portion 3203, an operation switch 3204, a display portion 3205, and the like. The mobile computer of the present invention is completed by applying the display device manufactured according to the present invention to the display portion 3205.

Figure 12D:
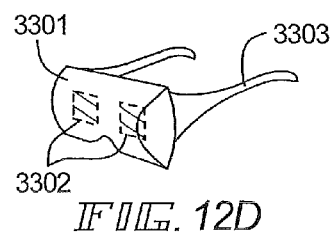

FIG. 12D is a goggle type display including a main body 3301, a display portion 3302, an arm portion 3303, and the like. A flexible substrate is used as a substrate for the display portion 3302, and the goggle type display is manufactured by making the display portion 3302 curved. A lightweight and thin goggle type display is realized. The goggle type display of the present invention is completed by applying the display device manufactured according to the present invention to the display portion 3302.

Figure 12E:
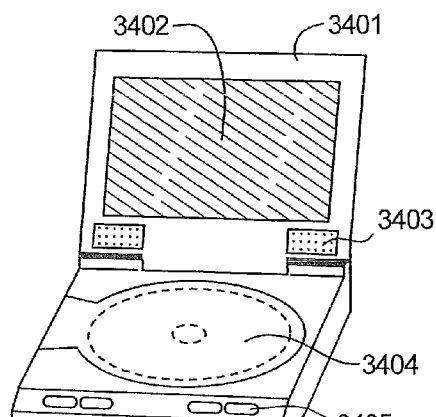

FIG. 12E is a player using a recording medium recording a program (hereinafter, referred to as a recording medium) which includes a main body 3401, a display portion 3402, a speaker portion 3403, a recording medium 3404, operation switches 3405, and the like. The player uses a DVD (digital versatile disc), a CD (compact disc), and the like as the recording medium, and can be used for music appreciation, film appreciation, games, and Internet. The recording medium of the present invention is completed by applying the display device manufactured according to the present invention to the display portion 3402.

Figure 12F:
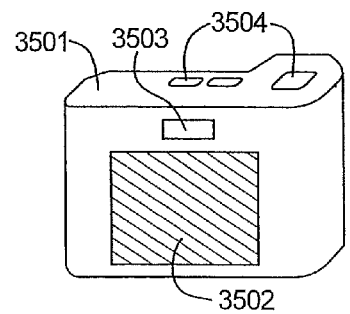

FIG. 12F is a digital camera including a main body 3501, a display portion 3502, a view finder 3503, operation switches 3504, an image receiving portion (not shown), and the like. The digital camera of the present invention is completed by applying the display device manufactured according to the present invention to the display portion 3502.

Figure 13A:
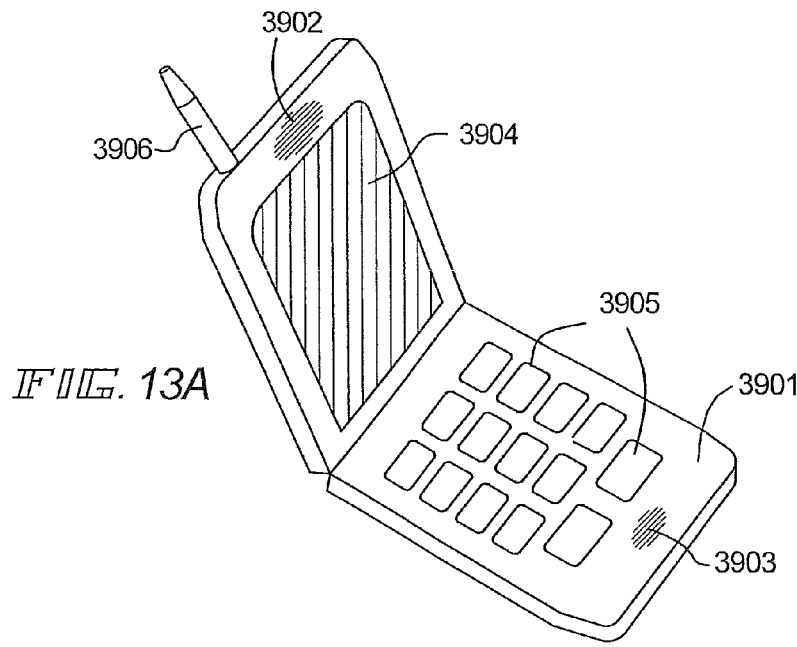
FIGS. 13A to 13C are diagrams showing examples of a display device.

FIG. 13A is a cellular phone including a main body 3901, a voice output portion 3902, a voice input portion 3903, a display portion 3904, operation switches 3905, an antenna 3906, and the like. The cellular phone of the present invention is completed by applying the display device manufactured according to the present invention to the display portion 3904.

Figure 13B:
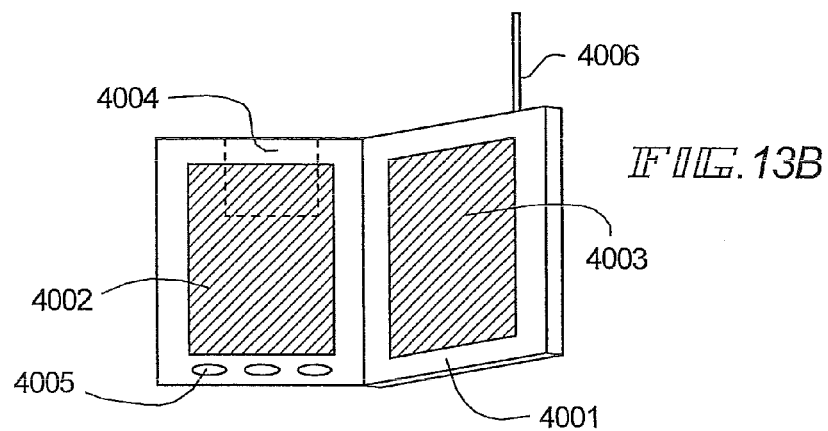

FIG. 13B is a portable book (electronic book) including a main body 4001, display portions 4002 and 4003, a recording medium 4004, operation switches 4005, an antenna 4006, and the like. The mobile book of the present invention is completed by applying the display device manufactured according to the present invention to the display portions 4002 and 4003.

Figure 13C:
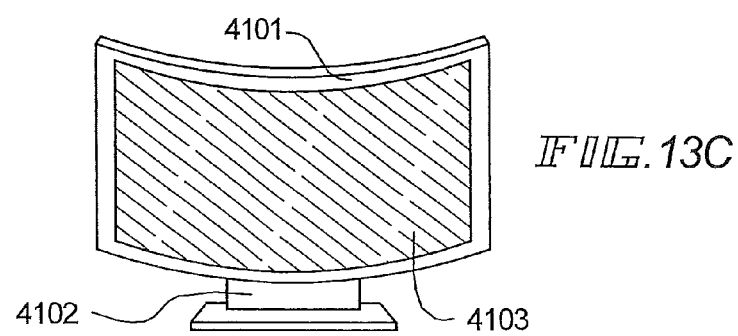
Figure 14:
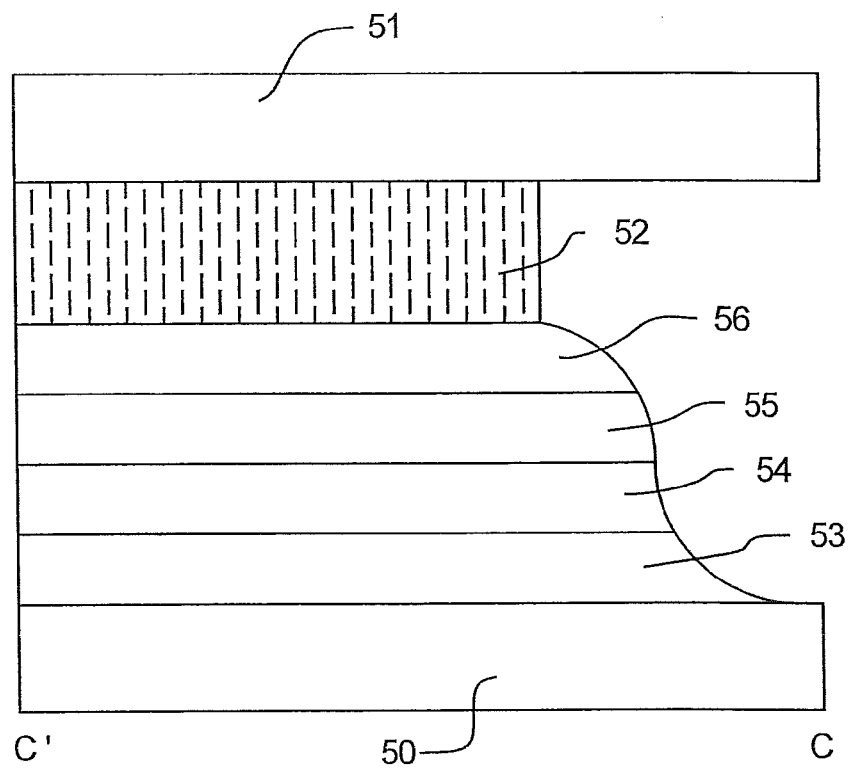
FIG. 14 is a diagram showing a conventional structure.

FIG. 13C is a display including a main body 4101, a supporting section 4102, a display portion 4103, and the like. The display portion 4103 is manufactured by using a flexible substrate, thereby realising a lightweight and thin display. In addition, the display portion can be made curved. The display of the present invention is completed by applying the display device manufactured according to the present invention to the display portion 4103.

As set forth above, the application range of the present invention is extremely wide, and the present invention can be applied to the electronic equipment in various fields.

Embodiment 5

In Embodiment 5, an example of a one-sided emission type display device manufactured according to Embodiment 1 will be described with reference to FIGS. 19A and 19B.

In FIG. 19A, reference numeral 1900 denotes a substrate, reference numeral 1950 is an interlayer insulating film, reference numeral 1952 denotes an electrode, reference numeral 1953 denotes a pixel electrode, reference numeral 1913 denotes an EL layer, reference numerals 1914, 1923 denote cathodes, reference numeral 1915 denotes an EL element, reference numeral 1922 denotes a passivation film, and reference numeral 1921 denotes a covering material. In a sealing region, an opening 1918 is formed at the side of the substrate 1900, and the opening is covered with the protective film 1919. The covering material 1921 and the substrate 1900 are bonded to each other with a sealing material 1917 formed over the opening and a protective film.

A display device as illustrated in FIG. 19A is a one-sided emission type and has a structure in which light is emitted in an upward direction as depicted by an arrow. In this case, the pixel electrode 1953 functions as an anode and is made of a reflective metal film. As for the reflective metal film, a metal film having higher work function such as platinum (Pt), and gold (Au) is used for making the metal film to serve as the anode. Since such metal films having higher work function are expensive, the pixel electrode may be formed as follows. The metal films having higher work function is laminated on an inexpensive metal film such as aluminum film and a tungsten film such that platinum or gold is exposed at least on a top surface. The cathode 1914 is a thin metal film (preferably with a thickness of from 10 nm and 50 nm), and is made of a material including an element belonging to Group 1 or 2 in the periodic table (for example, Al, Ag, Li, Ca, or an alloy of these such as MgAg, MgIn, AlLi, $CaF_2$, and CaN) with lower work function in order to make the metal film to function as a cathode. Further, a conductive oxide film (typically, an ITO film) that serves as the cathode 1923 is laminated on the cathode 1914, and then the passivation film 1922 is formed thereon.

When the structure as illustrated in FIG. 19A is employed, light generated from the EL element is reflected by the pixel electrode 1953, and emitted through the cathodes 1914 and 1923.

In FIG. 1913, reference numeral 1800 denotes a substrate, reference numeral 1852 denotes an electrode, reference numeral 1853 denotes a pixel electrode, reference numeral 1813 denotes an EL layer, reference numeral 1814 denotes a cathode, reference numeral 1815 denotes an EL element, reference numeral 1822 denotes a passivation film, and reference numeral 1821 denotes a covering material. In the sealing region, an opening 1818 is formed at the side of the substrate 1800, and the opening is covered with a protective film 1819. The covering material 1821 and the substrate 1800 are bonded together with a sealing material 1817 provided between the opening and the protective film.

FIG. 19B also shows a display device of one-sided emission type, which emits light in a downward direction as depicted by an arrow. In this embodiment, a transparent conductive film is formed and etched into a predetermined shape so as to form a pixel electrode 1853, which serves as an anode. As for the transparent conductive film, a compound of indium oxide and tin oxide, a compound of indium oxide and zinc oxide, zinc oxide, and tin oxide can be used. Preferably, the cathode 1814 is made of a metal film (with a thickness of from 50 nm to 200 nm) comprising Al, Ag, Li, Ca, or an alloy of these such as MgAg, MgIn, and AlLi. The passivation film 1822 is formed on the cathode 1814.

In the case of using the structure as depicted in FIG. 19B, light generated from the EL element passes through the pixel electrode 1853 and is emitted through the substrate 1800 side.

According to the present invention, the path for moisture in the display device, which is an insulating layer containing an organic resin material, is shut out. Therefore, it is possible to prevent moisture and oxygen, which exist outside of the display device from penetrating into the display element in the interior of the display device through the insulating film containing a hygroscopic organic material and the like. As a result, the deterioration of the display device can be prevented, thereby improving the reliability of the display device.

Embodiment 6

The reliability evaluation of a display device manufactured according to the present invention is carried out. More specifically, it is confirmed that the display device according to the present invention has an advantageous effect of blocking moisture from penetrating into the interior of the display device so as to prevent various deteriorations such as decrease in luminance of an EL element.

As described in Embodiment 3, the display device is manufactured in such a manner that wirings are formed in the periphery of a display panel. A sealing material is formed on the wirings to bond a TFT substrate and an opposing substrate. A cross sectional view of a sealing region composed of a sealing material in the periphery of the display panel is illustrated in FIG. 20A, while a result of reliability evaluation on the display panel is illustrated in FIG. 20B.

The display panel applied with the present invention is manufactured as follows. An insulating layer 70 is partly removed to form a depression, and then wirings and protective films 71a and 72a, which are made of the same material as a pixel electrode, are formed so as to cover the depression through the same step. The outer edge portion of the insulating layer 70 is also formed to cover the wirings and protective films 71b, 72b made of the same material as the pixel electrode, and a sealing material 73 is formed thereon. A TFT substrate 75 and an opposing substrate 76 are bonded to each other with the sealing material 73. The wirings are made of Al, the pixel electrode is made of ITO, and the insulating layer is made of acrylic.

Figure 20A:
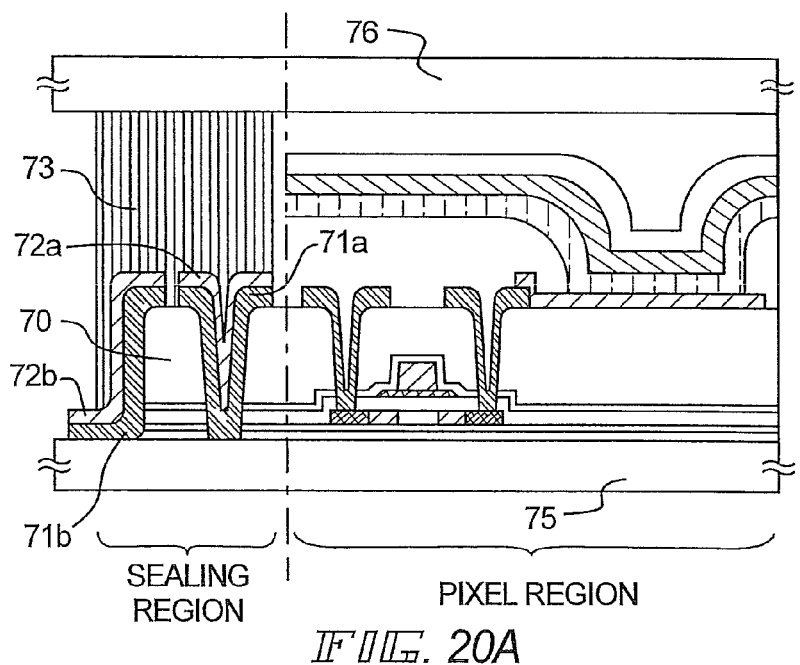
FIGS. 20A and 20B are diagrams showing reliability evaluation of a display device according to the present invention.
Figure 20B:
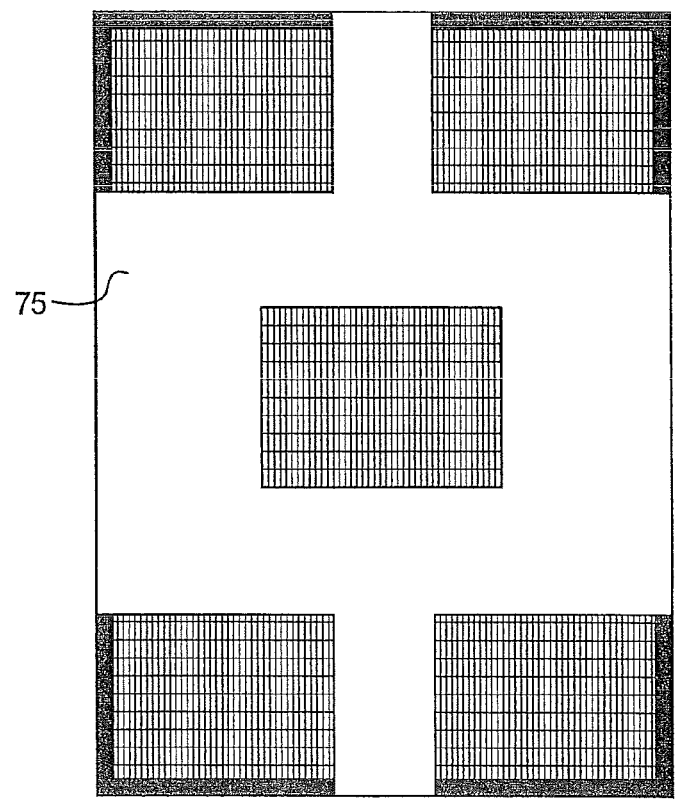

The display panel manufactured as illustrated in FIG. 20A is stored under an atmosphere with a temperature of 65° C. and a humidity of 95% for 1,000 hours, and then a voltage is applied thereto so as to make the display panel to emit light. FIG. 20B shows five observation photographs in which four photographs indicate corner portions and one photograph shows a central portion inside of a pixel portion of the display panel manufactured according to the present invention. The pixel portion as shown in the photographs is enlarged with a microscope, wherein a plurality of pixels emitting light respectively and constituting the pixel portion can be observed. Emission failures such as decrease in luminance and nonluminous portions are not observed in each pixel in any portions. It is further confirmed that deterioration in the EL element which contributes to light emission is not generated. As a result, the present invention provides an advantageous effect of blocking moisture outside of the display device which causes deterioration of the EL element from penetrating into the display device.

Figure 21A:
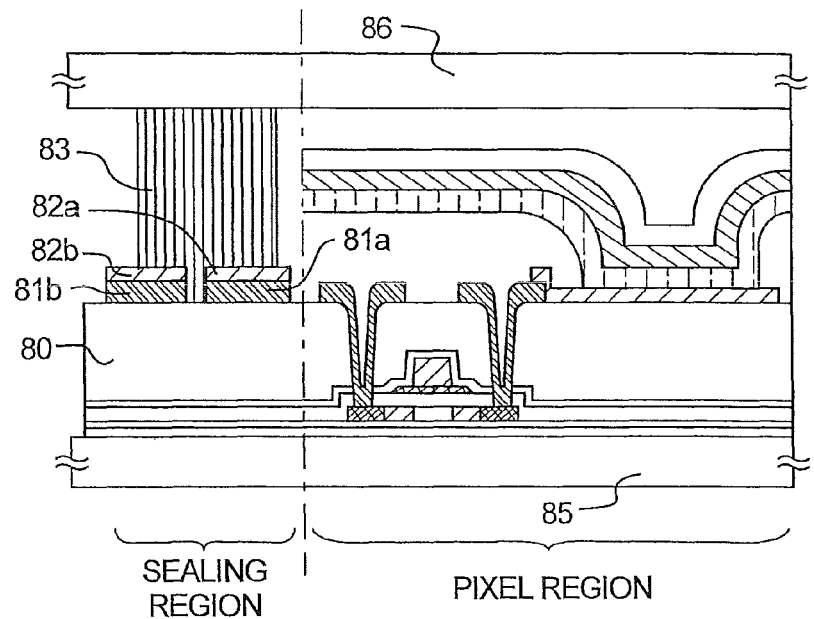
FIGS. 21A and 21B are diagrams showing reliability evaluation of a display device of a comparative example.
Figure 21B:
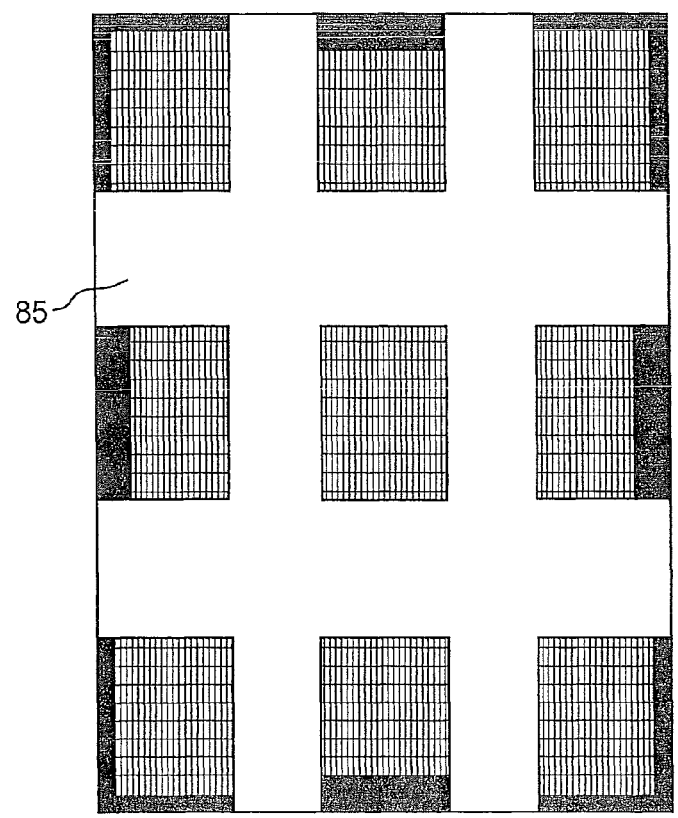

As a comparative example, another display panel is manufactured as follows. A depression is not formed in an insulating layer 80, wirings and wirings 81a, 81b, 82a, and 82b made of a pixel electrode are formed over the insulating layer 80, and then a TFT substrate 85 and an opposing substrate 86 are adhered to each other with a sealing material 83 formed over the wirings. A cross sectional view of the display device of the comparative example is illustrated in FIG. 21A, while the result of the reliability evaluation of the display panel is shown in FIG. 21B. In FIG. 21A, the insulating layer 80 is exposed to the outside air.

The display panel manufactured as depicted in FIG. 21A is stored under an atmosphere with a temperature of 65° C. and a humidity of 95% for 190 hours, and then a voltage is applied thereto so as to make the display panel to emit light. FIG. 21B shows nine observation photographs in which eight photographs indicate peripheral edge portions and one photograph indicates a central portion inside a pixel portion of the display panel of the comparative example. The pixel portion shown in the photographs is enlarged with a microscope, and a plurality of pixels emitting light individually and constituting the pixel portion can be observed in the photograph. In each pixel in the peripheral portions, however, nonluminous portions or portions in which luminance is degraded are generated from four corners of the panel nearly to pixels in the third rows and seventh columns even though the display panel is stored only for 190 hours. This is attributed to the fact that light-emitting materials constituting the EL element and the like are deteriorated by the penetration of moisture through the insulating layer 80 from the peripheral portions.

As set forth above, it is confirmed that a display panel with higher reliability in which decrease in luminance of the EL element is prevented can be manufactured according to the present invention.

What is claimed is:

1. A display device comprising:
   a silicon nitride film over a substrate;
   an insulating layer including an opening over the silicon nitride film;
   a conductive film over the insulating layer and in the opening; and
   a sealing material over the conductive film and the insulating layer,
   wherein the insulating layer comprises an organic resin material,
   wherein the opening is located at a periphery of the substrate, and
   wherein the opening and the sealing material overlap each other,
   wherein the conductive film is in contact with a top surface of the silicon nitride film through the opening, and
   wherein an outer edge portion of the insulating layer is located on an inner side of an outer edge portion of the sealing material.

2. The display device according to claim 1, wherein the outer edge portion of the insulating layer is covered with the sealing material.

3. The display device according to claim 1, wherein the outer edge portion of the insulating layer is covered with the conductive film.

4. The display device according to claim 1, wherein the conductive film comprises one or more elements selected from Al, Ti, Mo, W, and Si.

5. The display device according to claim 1, wherein the organic resin material comprises one or more materials selected from acrylic, polyamide, polyimide, and silicon oxide containing alkyl group.

6. The display device according to claim 2, further comprising a transistor,
   wherein a channel formation region of the transistor comprises crystalline silicon.

7. A display device comprising:
a silicon nitride film over a flexible substrate;
an insulating layer including an opening over the silicon nitride film;
a conductive film over the insulating layer and in the opening; and
a sealing material over the conductive film and the insulating layer,
wherein the insulating layer comprises an organic resin material,
wherein the opening is located at a periphery of the flexible substrate, and
wherein the opening and the sealing material overlap each other,
wherein the conductive film is in contact with a top surface of the silicon nitride film through the opening, and
wherein an outer edge portion of the insulating layer is located on an inner side of an outer edge portion of the sealing material.

8. The display device according to claim 7, wherein the outer edge portion of the insulating layer is covered with the sealing material.

9. The display device according to claim 7, wherein the outer edge portion of the insulating layer is covered with the conductive film.

10. The display device according to claim 7, wherein the conductive film comprises one or more elements selected from Al, Ti, Mo, W, and Si.

11. The display device according to claim 7, wherein the organic resin material comprises one or more materials selected from acrylic, polyamide, polyimide, and silicon oxide containing alkyl group.

12. The display device according to claim 7, further comprising a transistor,
wherein a channel formation region of the transistor comprises crystalline silicon.

13. A display device comprising:
a light-emitting element including an organic material in a pixel region;
a silicon nitride film over a flexible substrate;
an insulating layer including an opening over the silicon nitride film;
a conductive film over the insulating layer and in the opening; and
a sealing material over the conductive film and the insulating layer,
wherein the insulating layer comprises an organic resin material,
wherein the opening is located at a periphery of the flexible substrate, and
wherein the opening and the sealing material overlap each other,
wherein the conductive film is in contact with a top surface of the silicon nitride film through the opening, and
wherein an outer edge portion of the insulating layer is located on an inner side of an outer edge portion of the sealing material, and
wherein the opening is located at an outer side of the pixel region.

14. The display device according to claim 13, wherein the outer edge portion of the insulating layer is covered with the sealing material.

15. The display device according to claim 13, wherein the outer edge portion of the insulating layer is covered with the conductive film.

16. The display device according to claim 13, wherein the conductive film comprises one or more elements selected from Al, Ti, Mo, W, and Si.

17. The display device according to claim 13, wherein the organic resin material comprises one or more materials selected from acrylic, polyamide, polyimide, and silicon oxide containing alkyl group.

18. The display device according to claim 13, further comprising a transistor,
wherein a channel formation region of the transistor comprises crystalline silicon.

* * * * *

UNITED STATES PATENT AND TRADEMARK OFFICE
CERTIFICATE OF CORRECTION

PATENT NO. : 9,257,670 B2  
APPLICATION NO. : 14/556858  
DATED : February 9, 2016  
INVENTOR(S) : Masayuki Sakakura et al.

Page 1 of 1

It is certified that error appears in the above-identified patent and that said Letters Patent is hereby corrected as shown below:

In the Specification:

Column 6, Line 30; Change "layer, covering" to --layer; covering--.

Column 10, Line 37; Change "a in smooth" to --a smooth--.

Column 11, Line 18; Change "Further how" to --Further, how--.

Column 11, Line 39; Change "(CN) siloxane" to --(CN), siloxane--.

Column 12, Line 66; Change "Embodiment 1," to --In Embodiment 1,--.

Column 17, Line 34; Change "silicon, and" to --silicon and--.

Column 18, Line 7 to 8; Change "acrylic, polyimide, polyimide amide," to
   --acrylic, polyamide, polyimide amide,--.

Column 18, Line 39; Change "(AI)," to --(Al),--.

Column 20, Line 6; Change "n-conjugated" to --π-conjugated--.

Column 21, Line 38; Change "a α-correction" to --a γ-correction--.

Column 23, Line 52; Change "informed" to --formed--.

Column 24, Line 57; Change "compute; a" to --computer, a--.

Column 25, Line 52; Change "realising" to --realizing--.

Column 26, Line 38; Change "FIG. 1913," to --FIG. 19B,--.

In the Claims:

Column 28, Line 64, Claim 6; Change "claim 2," to --claim 1,--.

Signed and Sealed this
Fourteenth Day of June, 2016

Michelle K. Lee
*Director of the United States Patent and Trademark Office*